(12) United States Patent
Meng et al.

(10) Patent No.: US 8,431,245 B2
(45) Date of Patent: Apr. 30, 2013

(54) DEUTERATED COMPOUNDS FOR LUMINESCENT APPLICATIONS

(75) Inventors: Hong Meng, Wilmington, DE (US); Yulong Shen, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 289 days.

(21) Appl. No.: 12/643,567

(22) Filed: Dec. 21, 2009

(65) Prior Publication Data

US 2011/0095273 A1 Apr. 28, 2011

Related U.S. Application Data

(60) Provisional application No. 61/246,563, filed on Sep. 29, 2009.

(51) Int. Cl.
*H01L 51/54* (2006.01)
*C07C 15/20* (2006.01)
*C07D 307/91* (2006.01)
*C07D 407/10* (2006.01)
*C07D 407/14* (2006.01)

(52) U.S. Cl.
USPC ........... 428/690; 428/917; 313/504; 313/506; 549/460; 585/26; 257/40

(58) Field of Classification Search .................. None
See application file for complete search history.

(56) References Cited

U.S. PATENT DOCUMENTS

| 3,282,875 A | 11/1966 | Connolly et al. |
| 3,849,458 A | 11/1974 | Dinh |
| 4,053,311 A | 10/1977 | Limburg et al. |
| 4,358,545 A | 11/1982 | Ezzell et al. |
| 4,940,525 A | 7/1990 | Ezzell |
| 5,247,190 A | 9/1993 | Friend et al. |
| 5,254,633 A | 10/1993 | Han |
| 5,378,519 A | 1/1995 | Kikuchi et al. |
| 5,408,109 A | 4/1995 | Heeger et al. |
| 5,707,747 A | 1/1998 | Tomiyama et al. |
| 5,911,918 A | 6/1999 | Shacklette et al. |
| 5,929,194 A | 7/1999 | Woo et al. |
| 5,936,259 A | 8/1999 | Katz et al. |
| 5,962,631 A | 10/1999 | Woo et al. |
| 6,150,426 A | 11/2000 | Curtin et al. |
| 6,259,202 B1 | 7/2001 | Sturm et al. |
| 6,303,238 B1 | 10/2001 | Thompson et al. |
| 6,579,630 B2 | 6/2003 | Li et al. |
| 6,670,645 B2 | 12/2003 | Grushin et al. |

(Continued)

FOREIGN PATENT DOCUMENTS

| CN | 1668719 A | 9/2005 |
| CN | 1711334 A | 12/2005 |

(Continued)

OTHER PUBLICATIONS

International Search Report, PCT/US2009/068922, Dated Oct. 20, 2010.

(Continued)

*Primary Examiner* — Dawn Garrett

(57) ABSTRACT

This invention relates to deuterated compounds that are useful in electroluminescent applications. It also relates to electronic devices in which the active layer includes such a deuterated compound.

4 Claims, 1 Drawing Sheet

U.S. PATENT DOCUMENTS

| | | |
|---|---|---|
| 6,677,060 B2 | 1/2004 | Li et al. |
| 6,686,067 B2 | 2/2004 | Li et al. |
| 6,852,429 B1 | 2/2005 | Li et al. |
| 6,872,475 B2 | 3/2005 | Chen et al. |
| 6,875,524 B2 | 4/2005 | Hatwar et al. |
| 6,902,833 B2 | 6/2005 | Thompson et al. |
| 6,953,705 B2 | 10/2005 | Prakash |
| 7,023,013 B2 | 4/2006 | Ricks et al. |
| 7,075,102 B2 | 7/2006 | Grushin et al. |
| 7,125,952 B2 | 10/2006 | O'Dell et al. |
| 7,173,131 B2 | 2/2007 | Saitoh et al. |
| 7,183,010 B2 * | 2/2007 | Jarikov .................. 428/690 |
| 7,189,989 B2 | 3/2007 | Ise |
| 7,211,202 B2 | 5/2007 | Korzhenko et al. |
| 7,235,420 B2 | 6/2007 | Prakash et al. |
| 7,351,358 B2 | 4/2008 | Hsu et al. |
| 7,358,409 B2 | 4/2008 | Saitoh et al. |
| 7,362,796 B2 | 4/2008 | Shigeno |
| 7,365,230 B2 | 4/2008 | Herron et al. |
| 7,375,250 B2 | 5/2008 | Saitoh et al. |
| 7,390,438 B2 | 6/2008 | Hsu et al. |
| 7,402,681 B2 | 7/2008 | Ong et al. |
| 7,431,866 B2 | 10/2008 | Hsu et al. |
| 7,456,424 B2 | 11/2008 | Wu et al. |
| 7,462,298 B2 | 12/2008 | Hsu et al. |
| 7,491,450 B2 | 2/2009 | Okinaka et al. |
| 7,528,542 B2 | 5/2009 | Kawamura et al. |
| 7,540,978 B2 | 6/2009 | Pfeiffer et al. |
| 7,586,006 B2 | 9/2009 | Funahashi |
| 7,642,380 B2 | 1/2010 | Funahashi |
| 7,651,786 B2 | 1/2010 | Matsuura et al. |
| 7,651,788 B2 | 1/2010 | Seo et al. |
| 7,709,104 B2 | 5/2010 | Saitoh et al. |
| 7,722,785 B2 | 5/2010 | Hsu et al. |
| 7,745,017 B2 | 6/2010 | Nakamura et al. |
| 7,887,933 B2 | 2/2011 | Kathirgamanathan et al. |
| 8,026,665 B2 | 9/2011 | Kim et al. |
| 8,063,399 B2 | 11/2011 | Johansson et al. |
| 2001/0026878 A1 | 10/2001 | Woo et al. |
| 2001/0053462 A1 | 12/2001 | Mishima |
| 2002/0048687 A1 | 4/2002 | Hosokawa et al. |
| 2002/0076576 A1 | 6/2002 | Li et al. |
| 2002/0155319 A1 | 10/2002 | Kawamura et al. |
| 2003/0072966 A1 | 4/2003 | Hosokawa et al. |
| 2003/0118866 A1 | 6/2003 | Oh et al. |
| 2003/0134140 A1 * | 7/2003 | Li et al. .................. 428/621 |
| 2003/0138657 A1 | 7/2003 | Li |
| 2003/0168970 A1 | 9/2003 | Tominaga et al. |
| 2003/0224205 A1 | 12/2003 | Li et al. |
| 2003/0227001 A1 | 12/2003 | Li et al. |
| 2004/0004433 A1 | 1/2004 | Lamansky et al. |
| 2004/0038459 A1 | 2/2004 | Brown et al. |
| 2004/0082250 A1 | 4/2004 | Haoto |
| 2004/0094768 A1 | 5/2004 | Yu et al. |
| 2004/0102577 A1 | 5/2004 | Hsu et al. |
| 2004/0106003 A1 | 6/2004 | Chen et al. |
| 2004/0121184 A1 | 6/2004 | Thompson et al. |
| 2004/0127637 A1 | 7/2004 | Hsu et al. |
| 2004/0189190 A1 | 9/2004 | Suzuri et al. |
| 2004/0209118 A1 | 10/2004 | Seo et al. |
| 2004/0263067 A1 | 12/2004 | Saitoh et al. |
| 2005/0031898 A1 | 2/2005 | Charles et al. |
| 2005/0035335 A1 | 2/2005 | Han et al. |
| 2005/0063638 A1 | 3/2005 | Alger et al. |
| 2005/0064233 A1 | 3/2005 | Matsuura et al. |
| 2005/0073249 A1 | 4/2005 | Morii et al. |
| 2005/0079385 A1 * | 4/2005 | Nomura et al. ............. 428/690 |
| 2005/0158577 A1 | 7/2005 | Ishibashi et al. |
| 2005/0184287 A1 | 8/2005 | Herron et al. |
| 2005/0186106 A1 | 8/2005 | Li et al. |
| 2005/0187411 A1 | 8/2005 | Herron et al. |
| 2005/0191776 A1 | 9/2005 | Lamansky et al. |
| 2005/0205860 A1 | 9/2005 | Hsu et al. |
| 2005/0238920 A1 * | 10/2005 | Sotoyama et al. ............ 428/690 |
| 2005/0244670 A1 | 11/2005 | Saitoh et al. |
| 2005/0245752 A1 | 11/2005 | Conley et al. |
| 2005/0280008 A1 | 12/2005 | Ricks et al. |
| 2006/0033421 A1 | 2/2006 | Matsuura et al. |
| 2006/0043858 A1 | 3/2006 | Ikeda et al. |
| 2006/0052641 A1 | 3/2006 | Funahashi |
| 2006/0076557 A1 | 4/2006 | Waller et al. |
| 2006/0103298 A1 | 5/2006 | Lee |
| 2006/0113528 A1 | 6/2006 | Okinaka et al. |
| 2006/0115676 A1 | 6/2006 | Igawa et al. |
| 2006/0115678 A1 | 6/2006 | Saitoh et al. |
| 2006/0121312 A1 | 6/2006 | Yamada et al. |
| 2006/0127698 A1 | 6/2006 | Tokailin et al. |
| 2006/0128969 A1 | 6/2006 | Li et al. |
| 2006/0152146 A1 | 7/2006 | Funahashi |
| 2006/0154107 A1 | 7/2006 | Kubota et al. |
| 2006/0158102 A1 | 7/2006 | Kawamura et al. |
| 2006/0159838 A1 | 7/2006 | Kowalski et al. |
| 2006/0194074 A1 | 8/2006 | Funahashi |
| 2006/0210830 A1 | 9/2006 | Funahashi |
| 2006/0216411 A1 | 9/2006 | Steudel et al. |
| 2006/0217572 A1 | 9/2006 | Kawamura et al. |
| 2006/0251925 A1 | 11/2006 | Hosokawa et al. |
| 2006/0267488 A1 | 11/2006 | Saitoh et al. |
| 2006/0284140 A1 | 12/2006 | Breuning et al. |
| 2007/0031588 A1 | 2/2007 | Nakayama |
| 2007/0031701 A1 | 2/2007 | Nakashima et al. |
| 2007/0032632 A1 | 2/2007 | Tsukioka et al. |
| 2007/0063638 A1 | 3/2007 | Tokairin et al. |
| 2007/0066755 A1 | 3/2007 | Hsu et al. |
| 2007/0079927 A1 | 4/2007 | Lamansky et al. |
| 2007/0096082 A1 | 5/2007 | Gaynor et al. |
| 2007/0114917 A1 | 5/2007 | Funahashi et al. |
| 2007/0134511 A1 | 6/2007 | Kawamura et al. |
| 2007/0154735 A1 * | 7/2007 | Nakayama .................. 428/690 |
| 2007/0155991 A1 | 7/2007 | Funahashi |
| 2007/0172701 A1 * | 7/2007 | Tada ................. 428/690 |
| 2007/0181874 A1 | 8/2007 | Prakash et al. |
| 2007/0205409 A1 | 9/2007 | Lecloux et al. |
| 2007/0215864 A1 | 9/2007 | Luebben et al. |
| 2007/0228364 A1 | 10/2007 | Radu et al. |
| 2007/0236137 A1 | 10/2007 | Funahashi |
| 2007/0247063 A1 | 10/2007 | Murase et al. |
| 2007/0252511 A1 | 11/2007 | Funahashi |
| 2007/0255076 A1 | 11/2007 | Ito et al. |
| 2007/0285009 A1 | 12/2007 | Kubota |
| 2007/0292713 A9 | 12/2007 | Dobbs et al. |
| 2007/0298530 A1 | 12/2007 | Feehery |
| 2008/0012475 A1 * | 1/2008 | Oyamada et al. ............. 313/504 |
| 2008/0023676 A1 | 1/2008 | Hsu |
| 2008/0049413 A1 | 2/2008 | Jinde et al. |
| 2008/0067473 A1 | 3/2008 | Walker et al. |
| 2008/0071049 A1 | 3/2008 | Radu et al. |
| 2008/0086012 A1 | 4/2008 | Egawa et al. |
| 2008/0097076 A1 | 4/2008 | Radu et al. |
| 2008/0102312 A1 | 5/2008 | Parham et al. |
| 2008/0114178 A1 | 5/2008 | Kawakami et al. |
| 2008/0138655 A1 | 6/2008 | Lecloux et al. |
| 2008/0166566 A1 | 7/2008 | Prakash |
| 2008/0191614 A1 | 8/2008 | Kyoung-Soo et al. |
| 2008/0233433 A1 | 9/2008 | Igarashi et al. |
| 2008/0286566 A1 | 11/2008 | Prakash |
| 2008/0286605 A1 | 11/2008 | Takeda |
| 2008/0297037 A1 | 12/2008 | Vestweber et al. |
| 2008/0303425 A1 | 12/2008 | Rostovtsev et al. |
| 2008/0303428 A1 | 12/2008 | Rostovtsev et al. |
| 2008/0315754 A1 | 12/2008 | Kawamura et al. |
| 2009/0051281 A1 | 2/2009 | Inoue |
| 2009/0058279 A1 | 3/2009 | Akira |
| 2009/0079334 A1 | 3/2009 | Kim et al. |
| 2009/0114909 A1 | 5/2009 | Li et al. |
| 2009/0134781 A1 * | 5/2009 | Jang et al. .................. 313/504 |
| 2009/0184635 A1 | 7/2009 | Pan et al. |
| 2009/0206748 A1 | 8/2009 | Moriwaki et al. |
| 2009/0295274 A1 | 12/2009 | Hwang et al. |
| 2009/0302742 A1 | 12/2009 | Komori et al. |
| 2010/0108989 A1 | 5/2010 | Büsing et al. |
| 2010/0148161 A1 | 6/2010 | Kai et al. |
| 2010/0148162 A1 | 6/2010 | Komori et al. |
| 2010/0187505 A1 | 7/2010 | Stoessel et al. |
| 2010/0187506 A1 | 7/2010 | Park et al. |
| 2010/0187977 A1 | 7/2010 | Kai et al. |
| 2010/0187983 A1 | 7/2010 | Herron et al. |

| | | | |
|---|---|---|---|
| 2010/0314644 | A1 | 12/2010 | Nishimura et al. |
| 2011/0037062 | A1 | 2/2011 | Fukumatsu et al. |
| 2011/0095269 | A1 | 4/2011 | Zhang et al. |
| 2011/0095273 | A1 | 4/2011 | Meng et al. |
| 2011/0121269 | A1 | 5/2011 | Lecloux et al. |
| 2011/0147718 | A1 | 6/2011 | Howard, Jr. et al. |

FOREIGN PATENT DOCUMENTS

| | | |
|---|---|---|
| CN | 1768029 A | 5/2006 |
| CN | 1957646 A | 5/2007 |
| EP | 0443861 B1 | 5/1995 |
| EP | 681019 A2 | 9/1999 |
| EP | 1061112 A1 | 12/2000 |
| EP | 765106 A2 | 11/2002 |
| EP | 1277824 A1 | 1/2003 |
| EP | 1317005 A2 | 6/2003 |
| EP | 1437395 A2 | 7/2004 |
| EP | 1491609 A2 | 12/2004 |
| EP | 1491610 A2 | 12/2004 |
| EP | 1541657 A1 | 6/2005 |
| EP | 1561794 A1 | 8/2005 |
| EP | 1604974 A1 | 12/2005 |
| EP | 1612202 A1 | 1/2006 |
| EP | 1624500 A1 | 2/2006 |
| EP | 1672713 A1 | 6/2006 |
| EP | 1718124 A1 | 11/2006 |
| EP | 1737277 A1 | 12/2006 |
| EP | 1792893 A1 | 6/2007 |
| EP | 1860096 A1 | 11/2007 |
| EP | 1932895 A1 | 6/2008 |
| EP | 1933603 A1 | 6/2008 |
| EP | 1956022 A1 | 8/2008 |
| EP | 1995292 A1 | 11/2008 |
| EP | 2080762 A1 | 7/2009 |
| EP | 2085450 A1 | 8/2009 |
| EP | 2093271 A1 | 8/2009 |
| EP | 2067766 A1 | 10/2009 |
| EP | 2067767 A1 | 10/2009 |
| EP | 2189508 A2 | 5/2010 |
| JP | 04175395 A | 6/1992 |
| JP | 07249490 A | 9/1995 |
| JP | 08053397 A | 2/1996 |
| JP | 08167479 A | 6/1996 |
| JP | 10251633 A | 9/1998 |
| JP | 11224779 A | 8/1999 |
| JP | 11338172 A | 12/1999 |
| JP | 2000068073 A | 3/2000 |
| JP | 2000186066 A | 7/2000 |
| JP | 2001039933 A | 2/2001 |
| JP | 2001226331 A | 8/2001 |
| JP | 2003026641 A | 1/2003 |
| JP | 2003238501 A | 8/2003 |
| JP | 2003297582 A | 10/2003 |
| JP | 2003338380 A | 11/2003 |
| JP | 2004-10550 A | 1/2004 |
| JP | 2004014187 A | 1/2004 |
| JP | 2004071286 A | 3/2004 |
| JP | 2004107292 A | 4/2004 |
| JP | 2005232452 A | 9/2005 |
| JP | 2006016384 A | 1/2006 |
| JP | 2006052323 A | 2/2006 |
| JP | 2006-151844 A | 6/2006 |
| JP | 2006140235 A | 6/2006 |
| JP | 2006176493 A | 7/2006 |
| JP | 2006-219392 A | 8/2006 |
| JP | 2006328037 A | 12/2006 |
| JP | 2007-186449 A | 7/2007 |
| JP | 2007182432 A | 7/2007 |
| JP | 2007208165 A | 8/2007 |
| JP | 2009161470 A | 7/2009 |
| JP | 2009246354 A | 10/2009 |
| KR | 1020040079803 A | 9/2004 |
| KR | 1020050073233 A | 7/2005 |
| KR | 100702763 B1 | 4/2007 |
| KR | 1020070091293 A | 9/2007 |
| KR | 100765728 B1 | 10/2007 |
| KR | 10-2009-0046731 A | 5/2009 |
| KR | 10-2009-0086015 A | 8/2009 |
| KR | 10-2009-0086920 A | 8/2009 |
| KR | 10-2009-0093897 A | 9/2009 |
| WO | 9954385 A1 | 10/1999 |
| WO | 0053565 A1 | 9/2000 |
| WO | 0070655 A2 | 11/2000 |
| WO | 0141512 A1 | 6/2001 |
| WO | 03008424 A1 | 1/2003 |
| WO | 03040257 A1 | 5/2003 |
| WO | 03063555 A1 | 7/2003 |
| WO | 03091688 A2 | 11/2003 |
| WO | 2004016710 A1 | 2/2004 |
| WO | 2004018587 A1 | 3/2004 |
| WO | 2004041901 A1 | 5/2004 |
| WO | 2004058913 A1 | 7/2004 |
| WO | 2005000787 A1 | 1/2005 |
| WO | 2005031889 A2 | 4/2005 |
| WO | 2005049546 A1 | 6/2005 |
| WO | 2005049548 A1 | 6/2005 |
| WO | 2005049689 A2 | 6/2005 |
| WO | WO2005/052027 A1 | 6/2005 |
| WO | 2005115950 A1 | 12/2005 |
| WO | 2006001333 A1 | 1/2006 |
| WO | 2006025273 A1 | 3/2006 |
| WO | 2006043087 A1 | 4/2006 |
| WO | 2006057326 A1 | 6/2006 |
| WO | 2006063852 A1 | 6/2006 |
| WO | 2006076146 A2 | 7/2006 |
| WO | 2006090772 A1 | 8/2006 |
| WO | 2006112582 A1 | 10/2006 |
| WO | 2006121237 A1 | 11/2006 |
| WO | 2006137210 A1 | 12/2006 |
| WO | 2007004364 A1 | 1/2007 |
| WO | WO2007/021117 A1 | 2/2007 |
| WO | 2007065678 A1 | 6/2007 |
| WO | 2007-108666 A1 | 9/2007 |
| WO | 2007108457 A1 | 9/2007 |
| WO | WO2007-100096 A1 | 9/2007 |
| WO | WO2007-105917 A1 | 9/2007 |
| WO | 2007129702 A1 | 11/2007 |
| WO | 2008011953 A1 | 1/2008 |
| WO | 2008024378 A2 | 2/2008 |
| WO | 2008024379 A2 | 2/2008 |
| WO | 2008078114 A1 | 7/2008 |
| WO | 2008147721 A1 | 12/2008 |
| WO | WO2008-149968 A1 | 12/2008 |
| WO | 2009018009 A1 | 2/2009 |
| WO | WO2009/028902 A2 | 3/2009 |
| WO | WO2009-055628 A1 | 4/2009 |
| WO | 2009067419 A1 | 5/2009 |
| WO | 2009069790 A1 | 6/2009 |
| WO | 2010071362 A2 | 6/2010 |
| WO | 2010075421 A2 | 7/2010 |
| WO | 2010099534 A2 | 9/2010 |
| WO | 2010135403 A2 | 11/2010 |
| WO | 2011053334 A1 | 5/2011 |

OTHER PUBLICATIONS

CRC Handbook of Chemistry and Physics, 81$^{st}$ Edition (2000-2001) (Book Not Included).
"Flexible light-emitting diodes made from soluble conducting polymer" Nature, vol. 357, pp. 477 479 (Jun. 11, 1992).
Kirk-Othmer Encyclopedia of Chemical Technology, Fourth Edition, vol. 18, pp. 837-860, 1996 Y. Wang.
Markus, John, Electronics and Nucleonics dictionary, 470 and 476 (McGraw-Hill 1966).
International Search Report, Korean Intellectual Property Office, Daejeon, Republic of Korea, in PCT/2009/068918, PCT copending U.S. Appl. No. 12/643,403, Jun Gyu Kim, Authorized Officer, Jul. 26, 2010.
International Search Report, Korean Intellectual Property Office, Daejeon, Republic of Korea, in PCT/2010/025764, PCT copending U.S. Appl. No. 12/714,880, Hyun Shik Oh, Authorized Officer, Sep. 27, 2010.
International Search Report, Korean Intellectual Property Office, Daejeon, Republic of Korea, PCT/US2009/068921, PCT copending U.S. Appl. No. 12/643,486, Hyun Shik Oh, Authorized Officer, Aug. 5, 2010.

International Search Report, Korean Intellectual Property Office, Daejeon, Republic of Korea, in PCT/2009/068928, PCT copending U.S. Appl. No. 12/643,511, Hyun Shik Oh, Authorized Officer, Aug. 17, 2010.
International Search Report, Korean Intellectual Property Office, Daejeon, Republic of Korea, in PCT/2010/035356, PCT copending U.S. Appl. No. 12/782,781, Hyun Shik Oh, Authorized Officer, Dec. 24, 2010.
International Search Report, Korean Intellectual Property Office, Daejeon, Republic of Korea, in PCT/2009/068945, PCT copending U.S. Appl. No. 12/643,420, Hyun Shik Oh, Authorized Officer, Sep. 27, 2010.
International Search Report, Korean Intellectual Property Office, Daejeon, Republic of Korea, in PCT/2009/068950, PCT copending U.S. Appl. No. 12/643,449, Hyun Shik Oh, Authorized Officer, Jan. 3, 2011.
International Search Report, Korean Intellectual Property Office, Daejeon, Republic of Korea, in PCT/2009/068956, PCT copending U.S. Appl. No. 12/643,487, Hyun Shik Oh, Authorized Officer, Sep. 6, 2010.
International Search Report, Korean Intellectual Property Office, Daejeon, Republic of Korea, in PCT/2009/069255, PCT copending U.S. Appl. No. 12/643,459, Hyun Shik Oh, Authorized Officer, Aug. 13, 2010.
International Search Report, Korean Intellectual Property Office, Daejeon, Republic of Korea, in PCT/2009/068976, PCT copending U.S. Appl. No. 12/643,515, Bum Soo Kim, Authorized Officer, Jan. 28, 2011.
Wellmann et al., "High-Efficiency p-i-n Organic Light-Emitting Diodes with Long Lifetime," Journal of the SID, 2005, vol. 13/5, pp. 393-397.
Yamada et al., Synthesis of 2,9-Dichloro-1,10-phenanthroline from N,N'-Annelated Phenanthrolinediones, Bulletin of the Chemical Society of Japan, 1990, vol. 63, No. 9, pp. 2710-2712.
Yamamoto et al., "Electrically conducting and thermally stable ☐-conjugated poly(arylene)s prepared by organometallic process," Progress in Polymer Science, 1992, vol. 17, pp. 1153-1205.
Yan et al., "Synthesis and Nonlinear Optical Properties of Novel Multi-branched Two-Photon Polymerization Initiators," Journal of Material Chemistry, 2004, vol. 14, pp. 2295-3000.
Zhao et al., "Solid-State Dye-Sensitized Photovoltaic Device with Newly Designed Small Organic Molecule as Hole-Conductor," Chemical Physical Letters, 2007, vol. 445, pp. 259-264.
Zhu et al., "An Improved Preparation of Arylboronates: Application in One-Pot Suzuki Biaryl Synthesis," Journal of Organic Chemistry, 2003, vol. 68, pp. 3729-3732.
Extended European Search Report for Application No. 10746974.4, counterpart to U.S. Appl. No. 12/714,880; EPO; Nov. 5, 2012.
Extended European Search Report for Application No. 10778305.2, counterpart to U.S. Appl. No. 12/782,781; EPO; Nov. 5, 2012.
Extended European Search Report for Application No. EP 09844464.9, counterpart to U.S. Appl. No. 12/643,511; Oct. 26, 2012.
PCT International Search Report for Application No. PCT/US2010/061672, counterpart to U.S. Appl. No. 12/643,381; Kim, Dongseok, Authorized Officer; KIPO; Sep. 26, 2011.
PCT International Search Report for Application No. PCT/US2010/061677, counterpart to U.S. Appl. No. 12/643,576; Kim Dongseok, Authorized Officer; KIPO; Sep. 27, 2011.
PCT International Search Report for Application No. PCT/US2010/061680, counter part to U.S. Appl. No. 12/643,556; KIPO; Sep. 29, 2011.
"Color." (Definition) Web. Sep. 27, 2011, <http://hyperphysics.phy-astr.gsu/Hbase/vision/secpl>.
Appleby et al., Polymeric Perfluoro Bis-Sulfanomides as Possible Fuel Cell Electrolytes, J. Electrochem. Soc., 1993, vol. 140, pp. 109-111.
Beckmann et al., "Methyl Reorientation in Solid 3-ethychrysene and 3-isopropylesene; Solid State Nuclear Magnetic Resonance," 1998; vol. 12; pp. 251-256.
Boix et al., "Efficient H-D Exchange of Aromatic Compounds in Near-Critical D2O Catalyzed by a Polymer-Supported Sulphonic Acid," Tetrahedron Letters, 1999, vol. 40, pp. 4433-4436.

Borello et al., "Photodetectors," Kirk-Othmer Encyclopedia of Chemical Technology, Fourth Edition, 1999, vol. 18, pp. 1537-1538.
Braun et al., "Visible Light Emission from Semiconducting Polymer Diodes," Applied Physics Letters, 1991, vol. 58 (18), pp. 1982-1984.
Carey et al., Structure and Mechanisms; Advanced Organic Chemistry, Part A, 5th Edition, pp. 142-145.
Chen et al., "Efficient, Blue Light-Emnitting Diodes Using Cross-Linked Layers of Polymeric Arylamine and Fluorene," Synthetic Metals, 1999, vol. 107, pp. 129-138.
Chu et al., "Comparitive Study of Single and Multiemissive Layers in Inverted White Organic Light-Emitting Devices," Applied Physics Letters, 2006, vol. 89, No. 11, pp. 113502.
Chu et al., "Highly Efficient and Stable Inverted Bottom-Emission Organic Light Emitting Devices," Applied Physics Letters, 2006, vol. 89, 053503.
Colon et al., "High Molecular Weight Aromatic Polymers by Nickel Coupling of Aryl Polychlorides," Journal of Polymer Science, Part A, Polymer Chemistry Edition, 1990, vol. 28, pp. 367-383.
Constantini et al., "Infrared Spectroscopic Study of Polaron Formation in Electrochemically Synthesized Poly(3-alkylpyrroles)," Phys. Chem. Chem. Phys.,2003 vol. 5, pp. 749-757.
Danel et al., "Blue-Emitting Anthracenes with End-Capping Diarylamines," Chem. Mater., 2002, vol. 14, pp. 3860-3865.
Desmarteau, "Novel Perfluorinated Ionomers and Ionenes," Journal of Fluorine Chemistry, 1995, vol. 72, pp. 203-208.
Eaton et al., "Dihedral Angle of Biphenyl in Solution and the Molecular Force Field," J. Chem. Soc. Faraday Trans. 2, 1973, 60 pp. 1601-1608.
Esaki et al., "Efficient H/D Exchange Reactions of Alkyl-Substituted Benzene Derivatives by Means of the Pd/C—H—D2O System," Chemistry: A European Journal, 2007, vol. 13, pp. 4052-4063.
Feiring et al., "Aromatic Monomers with Pendant Fluoroalkylsulfonate and Sulfonimide Groups," Journal of Fluorine Chemistry, 2000, vol. 105, pp. 129-135.
Feiring et al., "Novel Aromatic Polymers with Pendant Lithium Perfluoroalkylsulfonate or Sulfinimide Groups," Macromolecules, 2000, vol. 33, pp. 9262-9271.
Guo et al., "Aromatic H/D Exchange Reaction Catalyzed by Groups 5 and 6 Metal Chlorides," Chinese Journal of Chemistry, 2005, vol. 23, pp. 341-344.
Hartwig, "Carbon-Heteroatom Bond Formation Catalyzed by Organometallic Complexes," Nature, 2008 vol. 455, No. 18, pp. 314-322.
Hartwig, "Discovery and Understanding of Transition-Metal-Catalyzed Aromatic Substitution Reactions," Syn Lett., 2006, No. 9, pp. 1283-1294.
He et al., "A Hole-Transporting Material with Controllable Morphology Containing Binaphtyl and Triphenylamine Chromophores," Advanced Functional Materials, vol. 16, No. 10, pp. 1343-1348, Year: 2006.
He et al., "High-efficiency Organic Polymer Light-emitting Heterostructure Devices on Flexible Plastic Substrates," Applied Physics Letters, 2000, vol. 76, No. 6, pp. 661-663.
Ishiyama et al., "Palladium(0)-Catalyzed Cross-Coupling Reaction of Alkoxydiboron with Haloarenes: A Direct Procedure for Arylboronic Esters," Journal of Organic Chemistry, 1995, vol. 60, pp. 7508-7510.
Kim et al., "Synthesis and Electroluminescent Properties of Highly Efficient Anthracene Derivatives with Bulky Side Groups," Organic Electronics, 2009, vol. 10, No. 5, pp. 822-833.
Klaerner et al., "Cross-Linkable Polymers Based on Dialkylfluorenes," Chemistry of Materials, 1999, 11, pp. 1800-1805.
Kodomari et al., "Selective Halogenation o f Aromatic Hydrocarbons," Journal of Organic Chemistry,1988, vol. 53, p. 2093.
Kumada, "Nickel and Palladium Complex Catalyzed Cross-Coupling Reactions of Organometallic Reagents with Organic Halides," Pure & Applied Chemistry, 1980, vol. 52, pp. 669-679.
Lee et al., "A Thermally Stable Hole Injection Material for Use in Organic Light-Emitting Diodes," Thin Solid Films, 2007, vol. 515, pp. 7726-7731.
Lee et al., "Poly(thieno(3,4-b)thiophene) A New Stable Low Band Gap Conducting Polymer," Macromolecules, 2001, vol. 34, pp. 5746-5747.

Leznoff et al., "Photocyclization of Aryl Polyenes. V. Photochemical Synthesis of Substituted Chrysenes," Canadian Journal of Chemistry, 1972, vol. 50, pp. 528-533.

Maeda et al., "Alkynylpyrenes as Improved Pyrene-Based Biomolecular Probes with the Advantages of High Fluorescence Quantum Yields and Long Absorption/Emission Wavelengths," Chemisty—A European Journal, 2006, vol. 12(3), pp. 824-831.

March, Aromatization of Six-Membered Rings, Advanced Organic Chemistry, Wiley-Interscience (1992), 4th Ed., pp. 1162-1164.

Minabe et al., "Electrophilic Substitution of Monosubstituted Pyrenes," Bulletin of the Chemical Society of Japan (1994), 67(1), pp. 172-179.

Mueller et al., "Synthesis and Characterization of Soluble Oligo(9,10-anthrylene)s," Chemische Berichte, 1994, 127, pp. 437-444.

Murata et al., "Novel Palladium(0)-Catalyzed Coupling Reaction of Dialkoxyborane with Aryl Halides: A Convenient Synthetic Route to Arylboronates," Journal of Organic Chemistry, 1997, vol. 62, pp. 6458-6459.

Murata et al., "Palladium-Catalyzed Borylation of Aryl Halides or Triflates with Dialkoxyborane: A Novel and Facile Synthetic Route to Aryboronates," Journal of Organic Chemistry, 2000, vol. 65, No. 1, pp. 164-168.

Negishi et al; III.2.15 Palladium Catalyzed Conjugate Substitution; Handbook of Organopalladium Chemistry for Organic Synthesis, 2000, vol. 1, pp. 767-789.

Negishi, "Palladium- or Nickel-Catalyzed Cross Coupling. A New Selective Method for Carbon-Carbon Bond Formation," Accounts of Chemical Research, 1982, vol. 15, pp. 340-348.

Noji et al., "A New Catalytic System for Aerobic Oxidative Coupling of 2-Naphthol Derivatives by the Use of CuCl-Amine Complex: A Practical Synthesis of Binaphthol Derivatives," Tetrahedron Letters, 1994, vol. 35, No. 43, pp. 7983-7984.

Norman et al., "The Reactions of Pyrene with Free Radicals and with Sodium," Journal of the Chemical Society, 1958, pp. 175-179.

Park et al., "Ab Inition Study of Pyrenes for Blue Organic Light-Emitting Diodes," Molecular Crystals and Liquid Crystals, 2006, vol. 444, pp. 177-184.

Sajiki et al., "Efficient C-H/C-D Exhange Reaction on the Alkyl Side Chain of Aromatic Compounds Using Heterogenous Pd/C in D2O," Organic Letters, 2004, vol. 6, No. 9, pp. 1485-1487.

Sheldon et al., "The Mechanism of the Collision-induced Loss of Methane from the Trimethylsilyl Negative Ion," Perkin Transaction II: Organic and Bio-Organic Chemistry, Journal of the Chemical Society (1988), (7), pp. 1263-1268.

Sotzing et al., "Poly(thieno(3,4-b)thiophene): A p- and n-Dopable Polythiophene Exhibiting High Optical Transparency in the Semiconducting State," Macromolecules, 2002, vol. 35, pp. 7281-7286.

Stille, "The Palladium-Catalyzed Cross-Coupling Reactions of Organotin Reagents with Organic Electrophiles," Angew. Chem. Int. Ed. Engl., 1986, vol. 25, pp. 508-524.

Sze, S.M., Physics of Semiconductor Devices, 2nd Edition, 1981, John Wiley & Sons, p. 492.

Wang et al., "Novel bis(8-hydroxyquinoline)phenolate-aluminum Complexes for Organic Light-emitting Diodes," Synthetic Metals, 2002, vol. 131, 1-3, pp. 1-5.

Watts et al., "A Novel Deuterium Effect of Dual Charge-Transfer and Ligand-Field Emission of the cis-Dichlorobis (2,2'-bipyridine)iridium(III) Ion," Journal of the American Chemical Society, 1979, vol. 101(10), pp. 2742-2743.

Weine et al., "Reactions of an O-Quinone Monoimide with Anthracenes, Phencyclone, and 1,3-Diphenylisobenzofuran," Journal of Organic Chemistry, 1989, vol. 54, pp. 5926-5930.

* cited by examiner

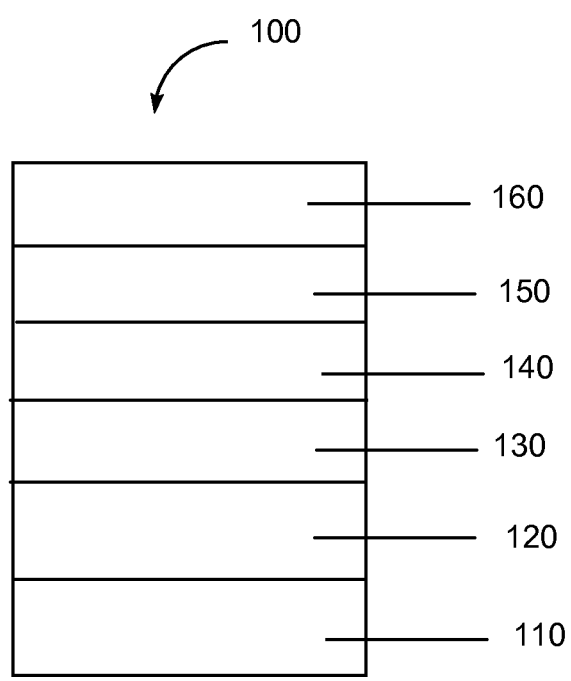

DEUTERATED COMPOUNDS FOR LUMINESCENT APPLICATIONS

RELATED APPLICATION DATA

This application claims priority under 35 U.S.C. §119(e) from U.S. Provisional Application No. 61/246,563 filed on Sep. 29, 2009, which is incorporated by reference herein in its entirety.

BACKGROUND

1. Field of the Disclosure

This invention relates to electroactive compounds which are at least partially deuterated. It also relates to electronic devices in which the active layers include such a compound.

2. Description of the Related Art

Organic electronic devices that emit light, such as light-emitting diodes that make up displays, are present in many different kinds of electronic equipment. In all such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, U.S. Pat. Nos. 5,247,190, 5,408,109, and Published European Patent Application 443 861. In many cases the electroluminescent compound is present as a dopant in a host material.

There is a continuing need for new materials for electronic devices.

SUMMARY

There is provided a diarylpyrene compound having at least one D substituent.

There is also provided an electronic device comprising an active layer comprising the above compound.

There is also provided a compound having Formula I:

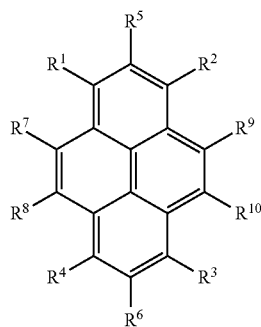

Formula I wherein:
R$^1$ through R$^4$ are the same or different and are selected from the group consisting of H, D, alkyl, alkoxy, oxy-alkyl, silyl, siloxane, and aryl, with the proviso that at least two of R$^1$ through R$^4$ are aryl; and
R$^5$ through R$^{10}$ are the same or different and are selected from the group consisting of H and D;
wherein there is at least one D.

There is also provided an electronic device comprising an active layer comprising a compound of Formula I.

BRIEF DESCRIPTION OF THE DRAWINGS

Embodiments are illustrated in the accompanying figures to improve understanding of concepts as presented herein.

FIG. 1 includes an illustration of one example of an organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are disclosed herein and are exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Electroactive Compound, the Electronic Device, and finally Examples.

1. Definitions and Clarification of Terms

Before addressing details of embodiments described below, some terms are defined or clarified.

As used herein, the term "aliphatic ring" is intended to mean a cyclic group that does not have delocalized pi electrons. In some embodiments, the aliphatic ring has no unsaturation. In some embodiments, the ring has one double or triple bond.

The term "alkoxy" refers to the group RO—, where R is an alkyl.

The term "alkyl" is intended to mean a group derived from an aliphatic hydrocarbon having one point of attachment, and includes a linear, a branched, or a cyclic group. The term is intended to include heteroalkyls. The term is intended to include substituted and unsubstituted groups. The term "hydrocarbon alkyl" refers to an alkyl group having no heteroatoms. The term "deuterated alkyl" is a hydrocarbon alkyl having at least one available H replaced by D. In some embodiments, an alkyl group has from 1-20 carbon atoms.

The term "aryl" is intended to mean a group derived from an aromatic hydrocarbon having one point of attachment. The term "aromatic compound" is intended to mean an organic compound comprising at least one unsaturated cyclic group having delocalized pi electrons. The term is intended to include heteroaryls. The term "hydrocarbon aryl" is intended to mean aromatic compounds having no heteroatoms in the ring. The term aryl includes groups which have a single ring and those which have multiple rings which can be joined by a single bond or fused together. The term "deuterated aryl" refers to an aryl group having at least one of the available H atoms which is bonded directly to the aryl replaced by D. The term "arylene" is intended to mean a group derived from an aromatic hydrocarbon having two points of attachment. Any suitable ring position of the aryl moiety may be covalently linked to the defined chemical structure. In some embodiments, a hydrocarbon aryl group has from 3-60 carbon atoms; in some embodiments, 6 to 30 carbon atoms. Heteroaryl groups may have from 3-50 carbon atoms; in some embodiments, 3-30 carbon atoms.

The term "branched alkyl" refers to an alkyl group having at least one secondary or tertiary carbon. The term "secondary alkyl" refers to a branched alkyl group having a secondary carbon atom. The term "tertiary alkyl" refers to a branched alkyl group having a tertiary carbon atom. In some embodiments, the branched alkyl group is attached via a secondary or tertiary carbon.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport material facilitate negative charge. Although light-emitting materials may also have some charge transport properties, the terms "charge, hole, or electron transport layer, material, member, or structure" are not intended to include a layer, material, member, or structure whose primary function is light emission.

The term "compound" is intended to mean an electrically uncharged substance made up of molecules that further consist of atoms, wherein the atoms cannot be separated by physical means. The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

The term "deuterated" is intended to mean that at least one available H has been replaced by D. A compound or group that is X % deuterated, has X % of the available H replaced by D.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "electroactive" as it refers to a layer or a material, is intended to indicate a layer or material which electronically facilitates the operation of the device. Examples of active materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The term "electroluminescence" refers to the emission of light from a material in response to an electric current passed through it. "Electroluminescent" refers to a material that is capable of electroluminescence.

The prefix "hetero" indicates that one or more carbon atoms have been replaced with a different atom. In some embodiments, the different atom is N, O, or S.

The term "host material" is intended to mean a material to which a dopant is added. The host material may or may not have electronic characteristic(s) or the ability to emit, receive, or filter radiation. In some embodiments, the host material is present in higher concentration.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device" or sometimes just "electronic device" is intended to mean a device including one or more organic electroactive layers or materials.

The term "oxyalkyl" is intended to mean a heteroalkyl group having one or more carbons replaced with oxygens. The term includes groups which are linked via an oxygen.

The term "silyl" refers to the group $R_3Si-$, where R is H, D, C1-20 alkyl, fluoroalkyl, or aryl. In some embodiments, one or more carbons in an R alkyl group are replaced with Si. In some embodiments, the silyl groups are $(hexyl)_2Si(Me)CH_2CH_2Si(Me)_2$- and $[CF_3(CF_2)_6CH_2CH_2]_2SiMe$-.

The term "siloxane" refers to the group $(RO)_3Si-$, where R is H, D, C1-20 alkyl, or fluoroalkyl.

The phrase "adjacent to," when used to refer to layers in a device, does not necessarily mean that one layer is immediately next to another layer. On the other hand, the phrase "adjacent R groups," is used to refer to R groups that are next to each other in a chemical formula (i.e., R groups that are on atoms joined by a bond).

All groups can be substituted or unsubstituted unless otherwise indicated. In some embodiments, the substituents are selected from the group consisting of D, halide, alkyl, alkoxy, aryl, and cyano. An optionally substituted group, such as, but not limited to, alkyl or aryl, may be substituted with one or more substituents which may be the same or different. Other suitable substituents include nitro, cyano, hydroxy, carboxy, alkenyl, alkynyl, aryloxy, alkoxycarbonyl, perfluoroalkyl, perfluoroalkoxy, arylalkyl, silyl, siloxane, thioalkoxy, $-S(O)_s$-aryl (where s=0-2) or $-S(O)_s$-heteroaryl (where s=0-2). Each R' and R" is independently an optionally substituted alkyl, cycloalkyl, or aryl group.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The IUPAC numbering system is used throughout, where the groups from the Periodic Table are numbered from left to right as 1-18 (CRC Handbook of Chemistry and Physics, 81st Edition, 2000).

2. Electroactive Compound

The electroactive compound described herein is a diarylpyrene having at least one D substituent. In some embodiments, the compound is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments, the electroactive compound has Formula I:

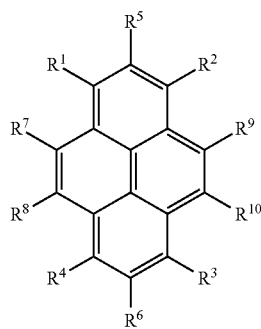

Formula I wherein:

$R^1$ through $R^4$ are the same or different and are selected from the group consisting of H, D, alkyl, alkoxy, oxyalkyl, silyl, siloxane, and aryl, with the proviso that at least two of $R^1$ through $R^4$ are aryl; and $R^5$ through $R^{10}$ are the same or different and are selected from the group consisting of H and D;

wherein there is at least one D.

In some embodiments of Formula I, the deuteration is present on the pyrene core. In some embodiments, at least one of $R^1$ through $R^{10}$ is D. In some embodiments, at least two of $R^1$ through $R^{10}$ are D; in some embodiments, at least three of $R^1$ through $R^{10}$ are D; in some embodiments, at least four of $R^1$ through $R^{10}$ are D; in some embodiments, at least five of $R^1$ through $R^{10}$ are D; in some embodiments, at least six of $R^1$ through $R^{10}$ are D; in some embodiments, at least seven of $R^1$ through $R^{10}$ are D; eight of $R^1$ through $R^{10}$ are D. The term "pyrene core" refers to the unit:

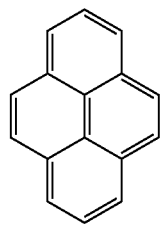 [SMILES: c1cc2ccc3cccc4ccc(c1)c2c34]

In some embodiments of Formula I, the deuteration is present on a substituent group on an aryl ring. In some embodiments, the substituent group is selected from alkyl, alkoxy, oxyalkyl, silyl, siloxane, aryl, and aryloxy. In some embodiments, the total of all substituent groups is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, the deuteration is on any one or more of the aryl groups bonded directly to the pyrene core. In this case, at least one of $R^1$ through $R^4$ is a deuterated aryl group. In some embodiments, the aryl groups bonded directly to the pyrene core are at least 10% deuterated. By this it is meant that at least 10% of all the available H bonded to aryl C in the aryl groups bonded directly to the pyrene core are replaced with D. In some embodiments, each aryl ring will have at least one D. In some embodiments, some, and not all of the aryl rings have at least one D. In some embodiments, the aryl groups bonded directly to the pyrene core are at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, the deuteration is on any one or more of $R^1$ through $R^4$. In some embodiments, each of $R^1$ through $R^4$ has at least one D. In some embodiments, $R^1$ through $R^4$ taken together are at least 10% deuterated. By this it is meant that at least 10% of all the available H bonded to C are replaced with D. In some embodiments, some, and not all of $R^1$ through $R^4$ have at least one D. In some embodiments, $R^1$ through $R^4$ taken together are at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, the deuteration is present on the substituent groups and the aryl groups bonded directly to the pyrene core. In some embodiments, the deuteration is present on the substituent groups and the pyrene core. In some embodiments, the deuteration is present on the pyrene core and the aryl groups bonded directly to the pyrene core. In some embodiments, the deuteration is present on the pyrene core, the aryl groups bonded directly to the pyrene core, and the substituent groups.

In some embodiments, the compound of Formula I is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments of Formula I, $R^1$ and $R^4$ are aryl and $R^2$ and $R^3$ are selected from H and D. In some embodiments, $R^1$ and $R^3$ are aryl and $R^2$ and $R^4$ are selected from H and D. In some embodiments, $R^1$, $R^2$, and $R^4$ are aryl and $R^4$ is selected from H and D. In some embodiments, $R^1$ through $R^4$ are all aryl.

Examples of aryl groups include, but are not limited to Ar1 through Ar93, shown in Table 1. The groups may be non-deuterated, as shown, or may have from one D up to full deuteration.

TABLE 1

| Ar | Chemical Structure of substituent |
|---|---|
| Ar1 | 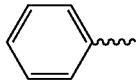 |
| Ar2 | 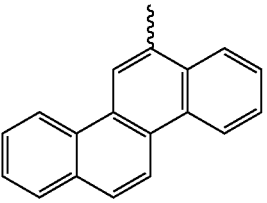 |
| Ar3 | 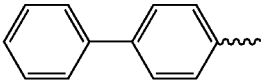 |
| Ar4 | 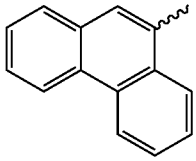 |
| Ar5 | 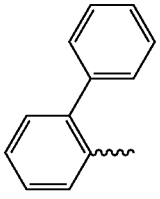 |
| Ar6 | 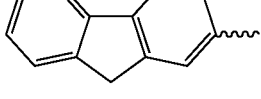 |

TABLE 1-continued

| Ar | Chemical Structure of substituent |
|---|---|
| Ar7 | 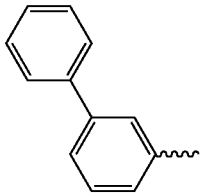 |
| Ar8 | 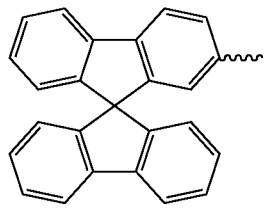 |
| Ar9 | 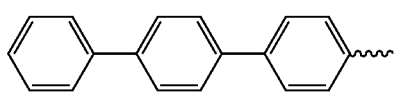 |
| Ar10 | 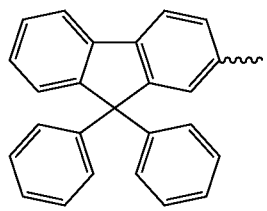 |
| Ar11 | 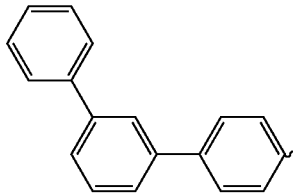 |
| Ar12 | 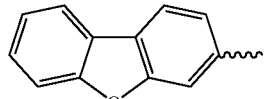 |
| Ar13 | 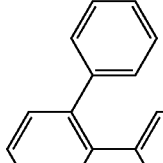 |
| Ar14 | 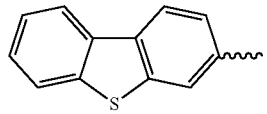 |
| Ar15 | 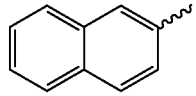 |

TABLE 1-continued
| Ar groups | |
|---|---|
| Ar | Chemical Structure of substituent |
| Ar16 | 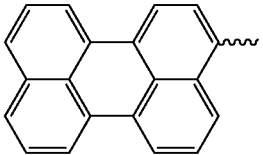 |
| Ar17 | 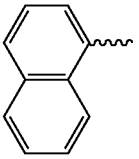 |
| Ar18 | 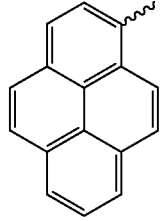 |
| Ar19 | 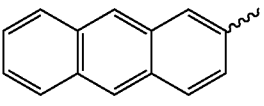 |
| Ar20 | 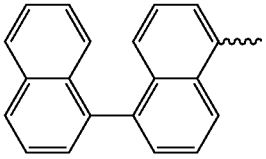 |
| Ar21 | 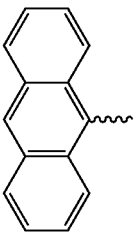 |
| Ar22 | 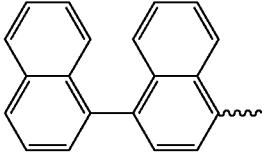 |
| Ar23 | 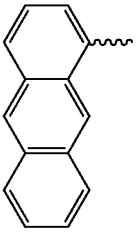 |
| Ar24 | 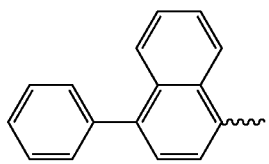 |
| Ar25 | 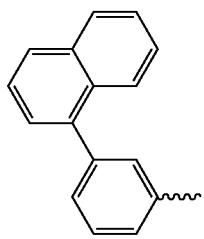 |
| Ar26 | 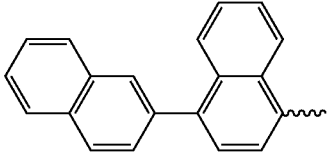 |
| Ar27 | 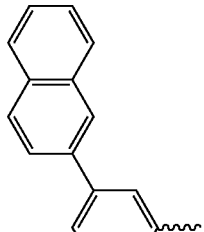 |
| Ar28 | 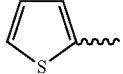 |
| Ar29 | 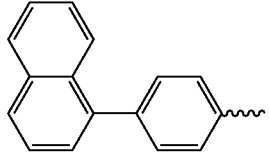 |
| Ar30 |  |
| Ar31 | 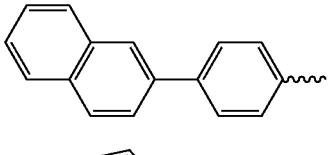 |
| Ar32 | 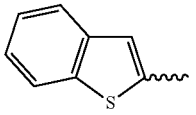 |

TABLE 1-continued
Ar groups
| Ar | Chemical Structure of substituent |
|---|---|
| Ar33 | 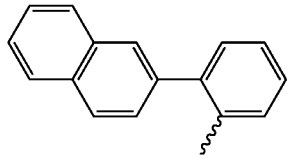 |
| Ar34 | 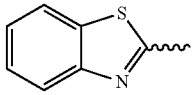 |
| Ar35 | 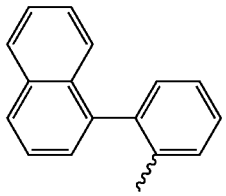 |
| Ar36 | 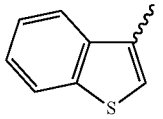 |
| Ar37 | 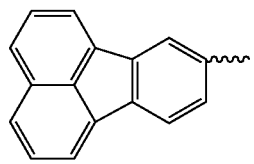 |
| Ar38 | 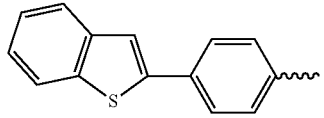 |
| Ar39 | 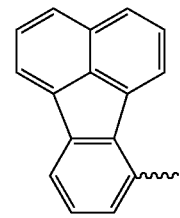 |
| Ar40 | 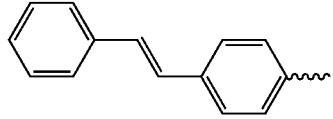 |
| Ar41 | 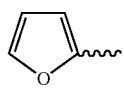 |
| Ar42 | 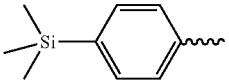 |
| Ar43 |  |
| Ar44 | 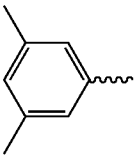 |
| Ar45 | 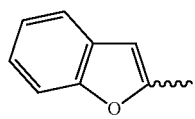 |
| Ar46 | 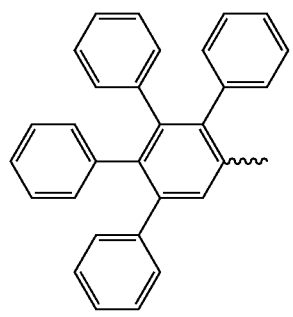 |
| Ar47 | 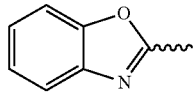 |
| Ar48 | 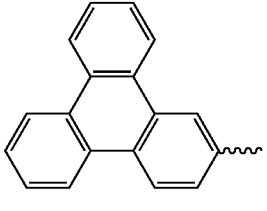 |
| Ar49 | 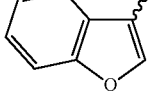 |
| Ar50 | 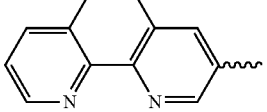 |
| Ar51 | 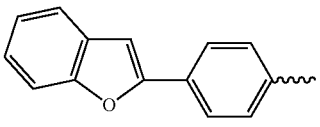 |

TABLE 1-continued
| Ar | Chemical Structure of substituent |
|---|---|
| Ar52 | 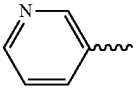 |
| Ar53 | 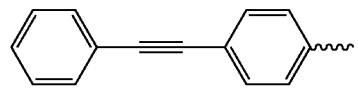 |
| Ar54 | 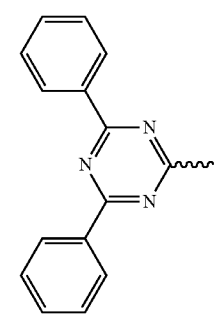 |
| Ar55 | 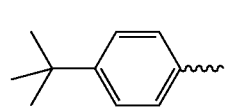 |
| Ar56 | 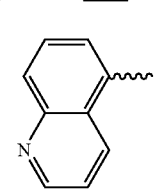 |
| Ar57 | 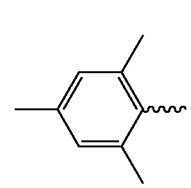 |
| Ar58 | 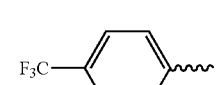 |
| Ar59 | 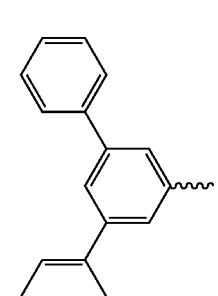 |
| Ar60 | 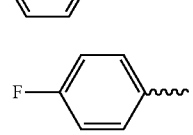 |
| Ar61 | 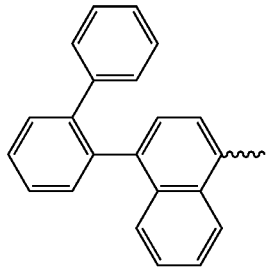 |
| Ar62 | 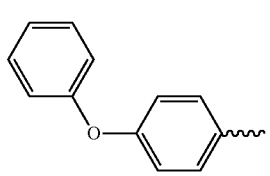 |
| Ar63 | 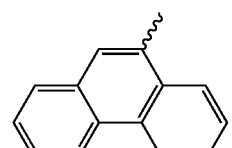 |
| Ar64 | $C_6F_{13}H_2C$—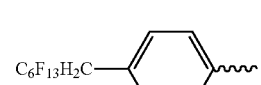 |
| Ar65 | 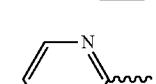 |
| Ar66 | $C_6F_{13}$—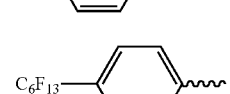 |
| Ar67 | 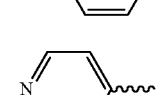 |
| Ar68 | 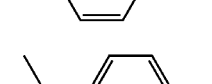 |
| Ar69 | 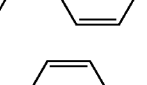 |
| Ar70 | 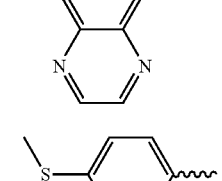 |
| Ar71 | NC—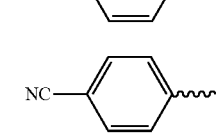 |

TABLE 1-continued

Ar groups

| Ar | Chemical Structure of substituent |
|---|---|
| Ar72 | 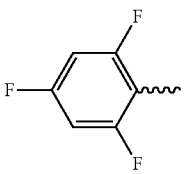 |
| Ar73 | 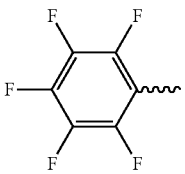 |
| Ar74 | 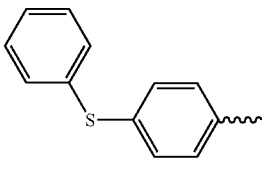 |
| Ar75 | 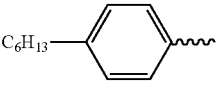 |
| Ar76 | 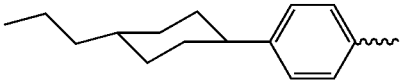 |
| Ar77 | 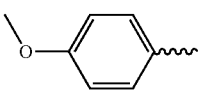 |
| Ar78 | 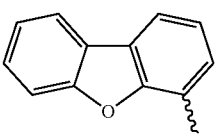 |

In some embodiments, at least one of $R^1$ through $R^4$ has Formula II

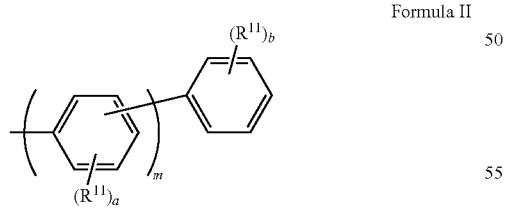

Formula II where:
  $R^{11}$ is the same or different at each occurrence and is selected from the group consisting of D, alkyl, alkoxy, aryl, silyl, and siloxane, or adjacent $R^{11}$ groups can be joined to form an aromatic ring;
  a is the same or different at each occurrence and is an integer from 0-4; b is the same or different at each occurrence and is an integer from 0-5; and
  m is the same or different at each occurrence and is an integer from 0 to 6.

In some embodiments, at least one of $R^1$ through $R^4$ has Formula IIa:

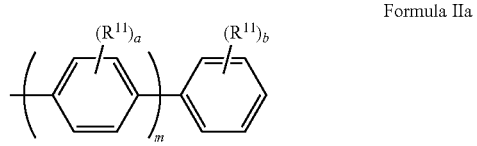

Formula IIa where $R^{11}$, a, b, and m are as defined above for Formula II.

In some embodiments, at least one of $R^1$ through $R^4$ is selected from the group consisting of phenyl, naphthyl, phenylnaphthyl, naphthylphenyl, fluorenyl, dibenzofuranyl, substituted analogs thereof, and deuterated analogs thereof. In some embodiments, at least one of $R^1$ through $R^4$ is selected from the group consisting of 3-naphthalen-1-yl-phenyl, 3-naphthalen-2-yl-phenyl, 1-naphthalen-2-yl-6-(4-naphthalen-1-yl-phenyl), 4-naphthalen-1-yl-phenyl, 4-dibenzofuranyl, and deuterated analogs thereof.

In some embodiments, the electroactive compound is selected from A1 through A34 below.

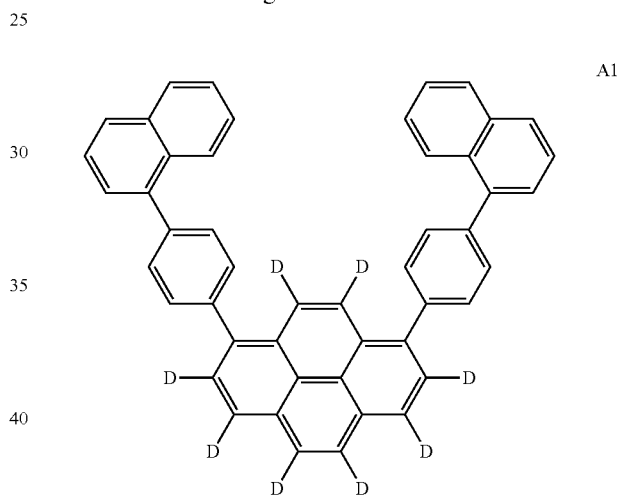

A1

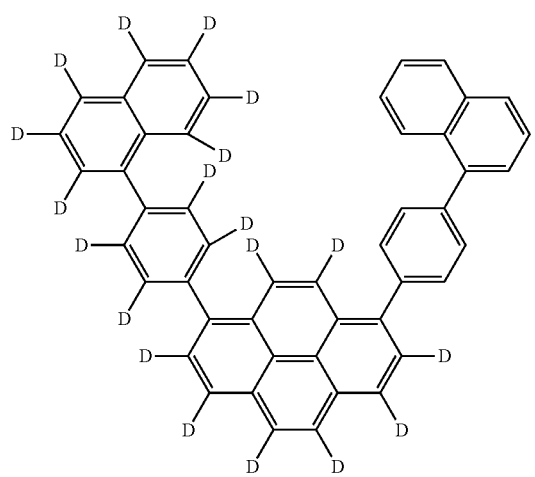

A2

A3
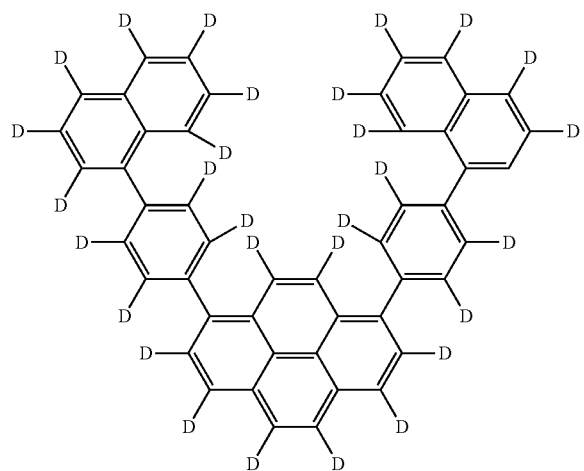
A4
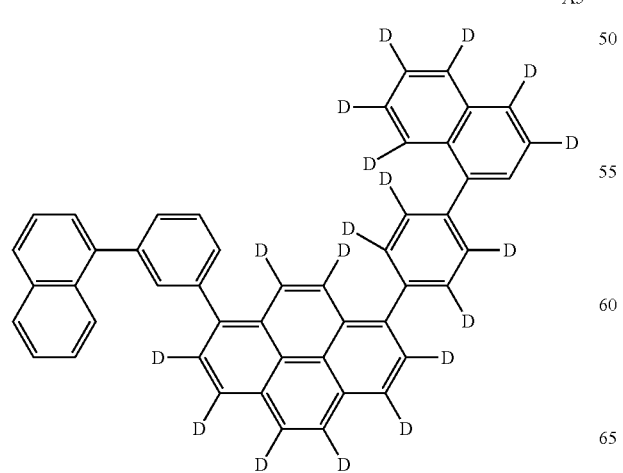
A5
A6
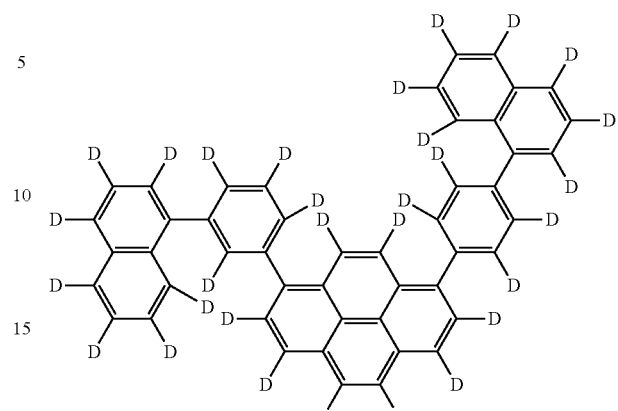
A7
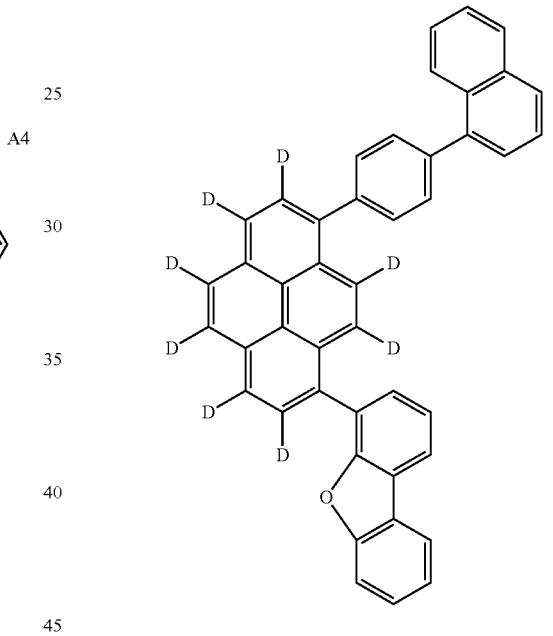
A8
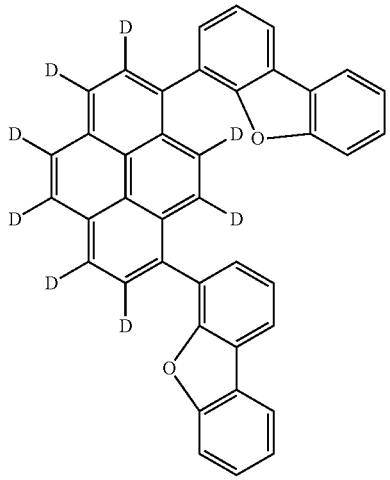

A9
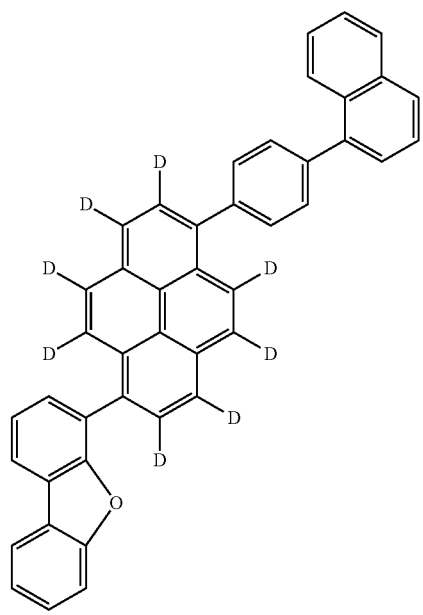
A10
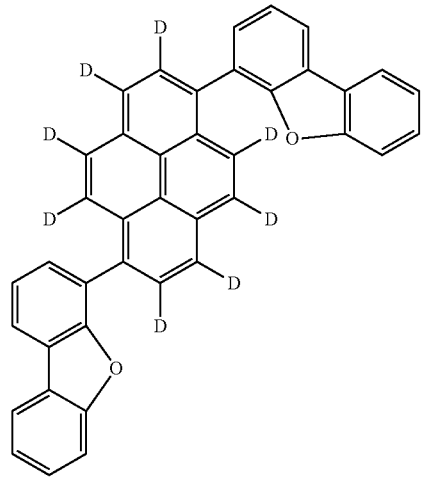
A11
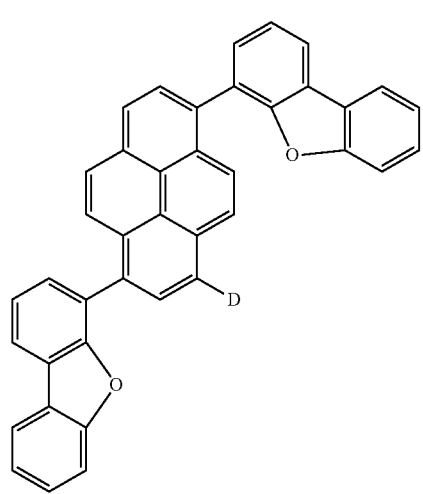
A12
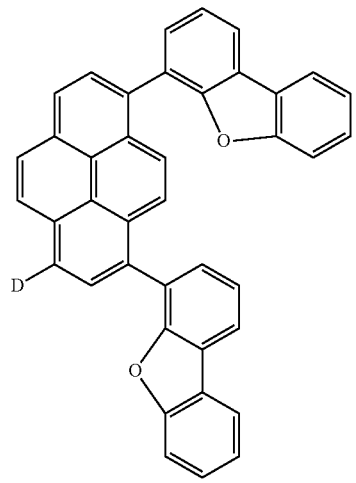
A13
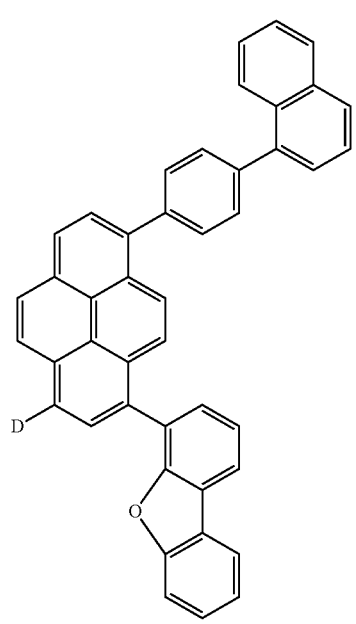
A14
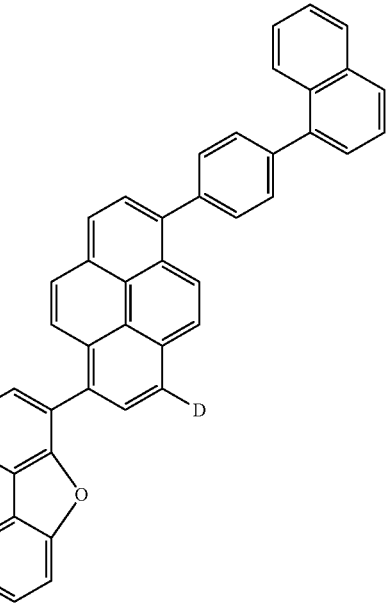

A15
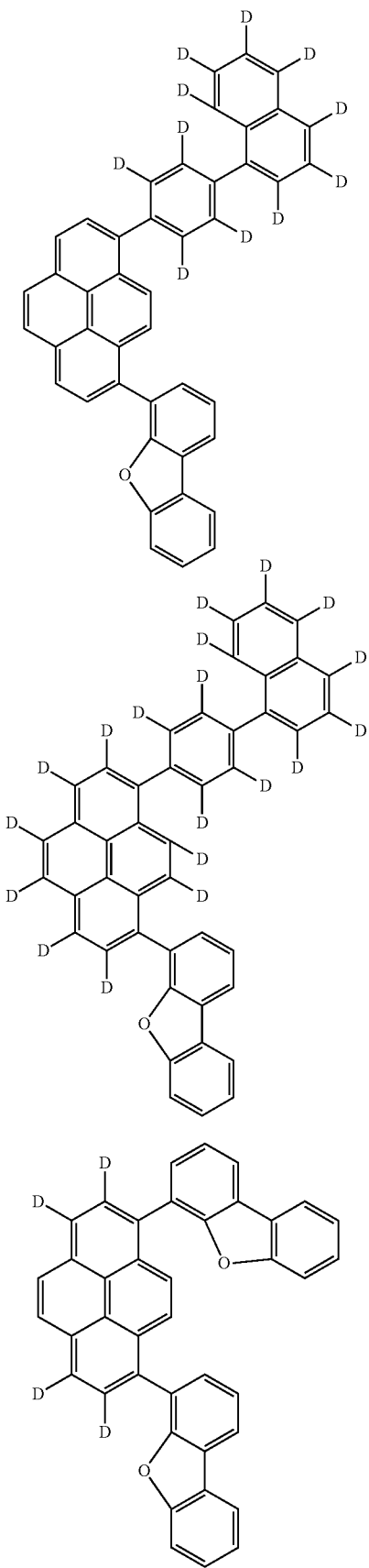
A16
A17
A18
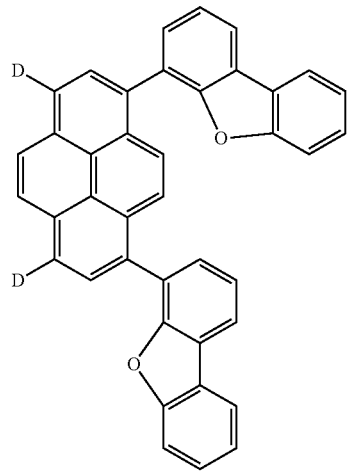
A19
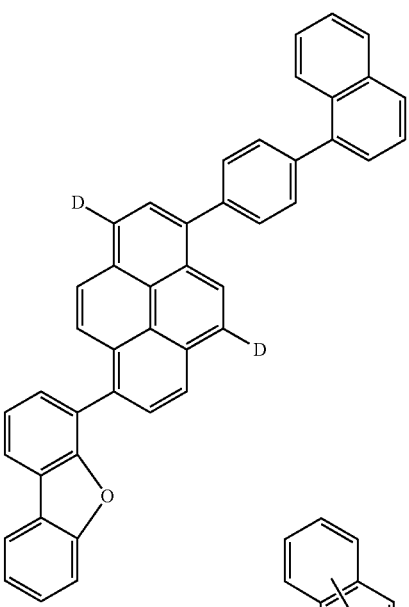
A20
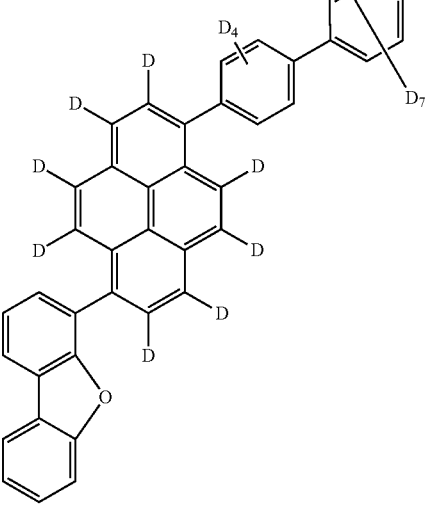

-continued
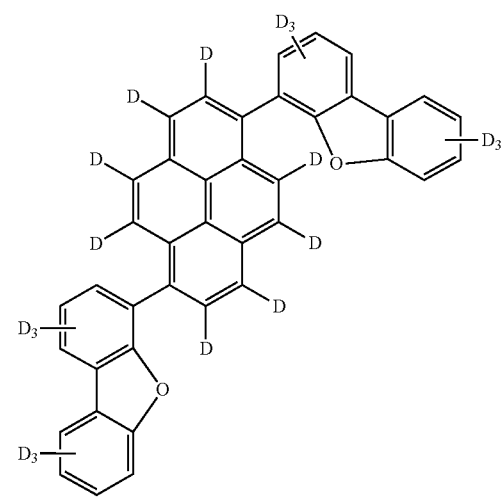
A21
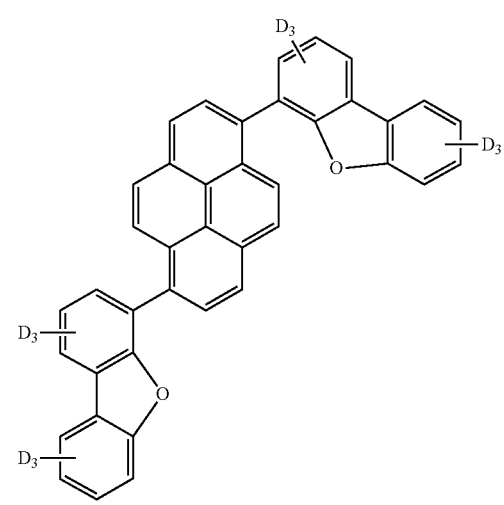
A22
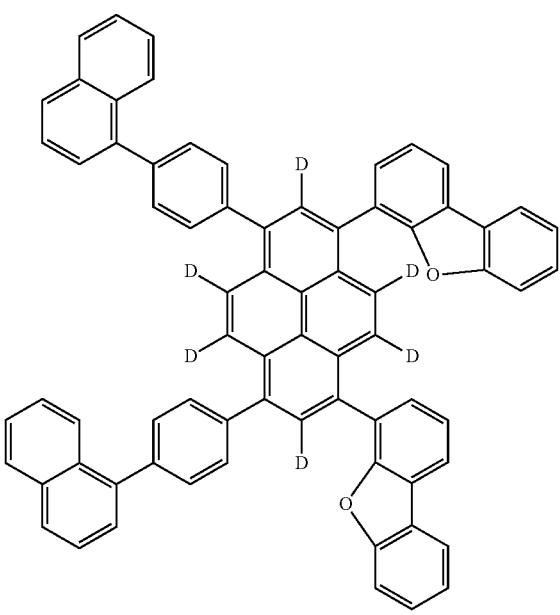
A23
-continued
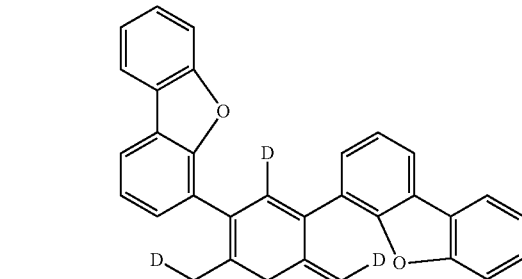
A24
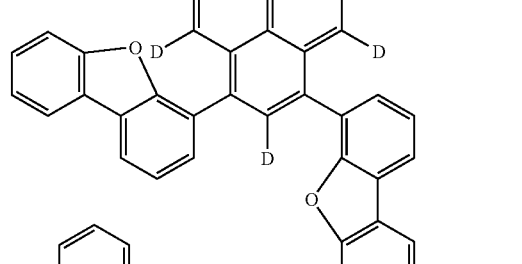
A25
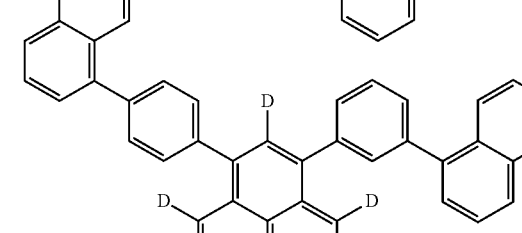
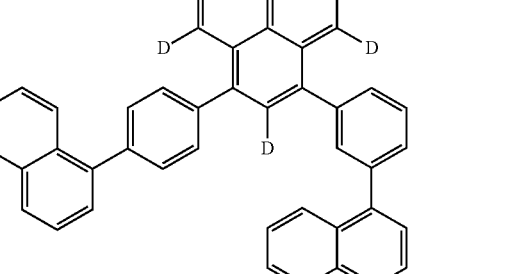
A26
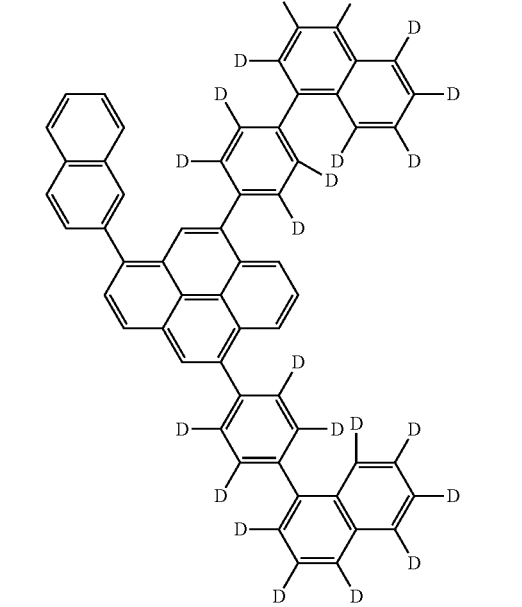

A27
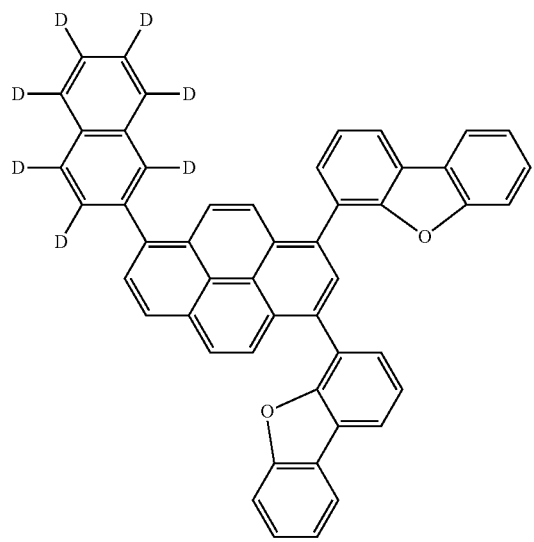
A28
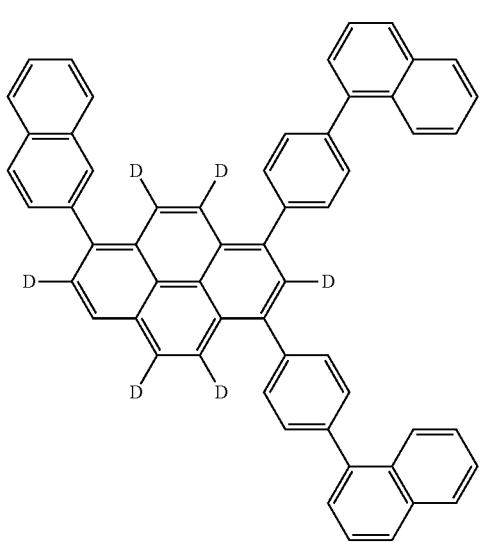
A29
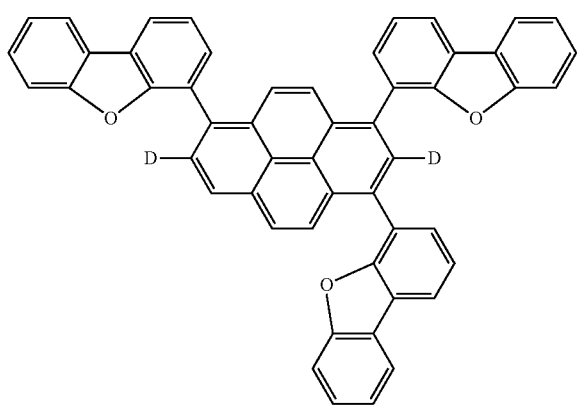
A30
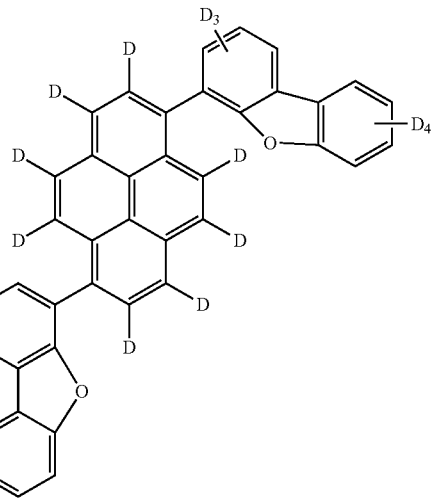
A31
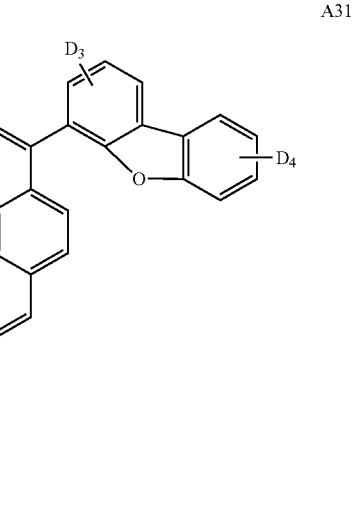
A32
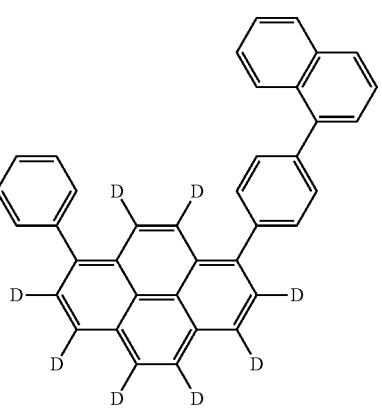

-continued

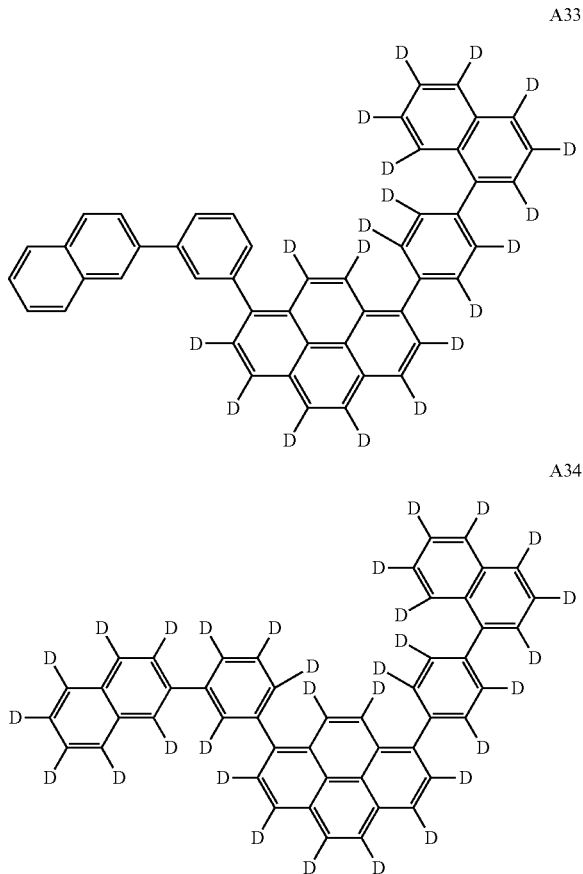

A33

A34

The non-deuterated analog compounds can be made using any technique that will yield a C—C bond. A variety of such techniques are known, such as Suzuki, Yamamoto, Stille, and Pd- or Ni-catalyzed C—C couplings. The new deuterated compound can then be prepared in a similar manner using deuterated precursor materials or, more generally, by treating the non-deuterated compound with deuterated solvent, such as d6-benzene, in the presence of a Lewis acid H/D exchange catalyst, such as aluminum trichloride or ethyl aluminum chloride. Exemplary preparations are given in the Examples. The level of deuteration can be determined by NMR analysis and by mass spectrometry, such as Atmospheric Solids Analysis Probe Mass Spectrometry (ASAP-MS).

The compounds described herein can be formed into films using liquid deposition techniques. Surprisingly and unexpectedly, these compounds have greatly improved properties when compared to analogous non-deuterated compounds. Electronic devices including an active layer with the compounds described herein, have greatly improved lifetimes. In addition, the lifetime increases are achieved without sacrificing other device properties. Furthermore, the deuterated compounds described herein have greater air tolerance than the non-deuterated analogs. This can result in greater processing tolerance both for the preparation and purification of the materials and in the formation of electronic devices using the materials.

The new deuterated compounds described herein have utility as hole transport materials, as electroluminescent materials, and as hosts for electroluminescent materials.

3. Electronic Device

Organic electronic devices that may benefit from having one or more layers comprising the electroluminescent materials described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode).

One illustration of an organic electronic device structure is shown in FIG. 1. The device 100 has a first electrical contact layer, an anode layer 110 and a second electrical contact layer, a cathode layer 160, and an electroactive layer 140 between them. Adjacent to the anode is a hole injection layer 120. Adjacent to the hole injection layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

Layers 120 through 150 are individually and collectively referred to as the active layers.

In one embodiment, the different layers have the following range of thicknesses: anode 110, 500-5000 Å, in one embodiment 1000-2000 Å; hole injection layer 120, 50-2000 Å, in one embodiment 200-1000 Å; hole transport layer 130, 50-2000 Å, in one embodiment 200-1000 Å; electroactive layer 140, 10-2000 Å, in one embodiment 100-1000 Å; layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

Depending upon the application of the device 100, the electroactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966).

One or more of the new deuterated materials described herein may be present in one or more of the active layers of a device. The deuterated materials may be used alone or in combination with non-deuterated materials.

In some embodiments, the new deuterated compounds are useful as hole transport materials in layer 130. In some embodiments, at least one additional layer includes a deuterated material. In some embodiments, the additional layer is the hole injection layer 120. In some embodiments, the additional layer is the electroactive layer 140. In some embodiments, the additional layer is the electron transport layer 150.

In some embodiments, the new deuterated compounds are useful as host materials for electroluminescent dopant materials in electroactive layer 140. In some embodiments, the dopant material is also deuterated. In some embodiments, at least one additional layer includes a deuterated material. In some embodiments, the additional layer is the hole injection layer 120. In some embodiments, the additional layer is the hole transport layer 130. In some embodiments, the additional layer is the electron transport layer 150.

In some embodiments, the new deuterated compounds are useful as electroluminescent materials in electroactive layer 140. In some embodiments, a host is also present in the electroactive layer. In some embodiments, the host material is also deuterated. In some embodiments, at least one additional layer includes a deuterated material. In some embodiments, the additional layer is the hole injection layer 120. In some embodiments, the additional layer is the hole transport layer 130. In some embodiments, the additional layer is the electron transport layer 150

In some embodiments, the new deuterated compounds are useful as electron transport materials in layer 150. In some embodiments, at least one additional layer includes a deuterated material. In some embodiments, the additional layer is the hole injection layer 120. In some embodiments, the additional layer is the hole transport layer 130. In some embodiments, the additional layer is the electroactive layer 140.

In some embodiments, an electronic device has deuterated materials in any combination of layers selected from the group consisting of the hole injection layer, the hole transport layer, the electroactive layer, and the electron transport layer.

In some embodiments, the devices have additional layers to aid in processing or to improve functionality. Any or all of these layers can include deuterated materials. In some embodiments, all the organic device layers comprise deuterated materials. In some embodiments, all the organic device layers consist essentially of deuterated materials.

a. Electroactive Layer

The new deuterated compounds of Formula I are useful as host materials for electroactive dopant materials in layer 140. The compounds can be used alone, or in combination with a second host material. The new deuterated compounds can be used as a host for dopants with any color of emission. In some embodiments, the new deuterated compounds are used as hosts for green- or blue-emissive materials.

In some embodiments, the electroactive layer consists essentially of a host material having Formula I and one or more electroactive dopants. In some embodiments, the electroactive layer consists essentially of a first host material having Formula I, a second host material, and an electroactive dopant. Examples of second host materials include, but are not limited to, chrysenes, phenanthrenes, triphenylenes, phenanthrolines, naphthalenes, anthracenes, quinolines, isoquinolines, quinoxalines, phenylpyridines, benzodifurans, and metal quinolinate complexes.

The amount of dopant present in the electroactive composition is generally in the range of 3-20% by weight, based on the total weight of the composition; in some embodiments, 5-15% by weight. When a second host is present, the ratio of first host having Formula I to second host is generally in the range of 1:20 to 20:1; in some embodiments, 5:15 to 15:5. In some embodiments, the first host material having Formula I is at least 50% by weight of the total host material; in some embodiments, at least 70% by weight.

In some embodiments, the second host material has Formula III:

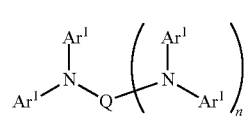

Formula III where:
Ar$^1$ is the same or different at each occurrence and is an aryl group;
Q is selected from the group consisting of multivalent aryl groups and

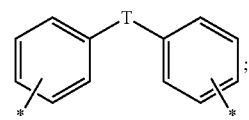

T is selected from the group consisting of (CR')$_a$, SiR$_2$, S, SO$_2$, PR, PO, PO$_2$, BR, and R;
R is the same or different at each occurrence and is selected from the group consisting of alkyl, and aryl;
R' is the same or different at each occurrence and is selected from the group consisting of H, D, and alkyl;
a is an integer from 1-6; and
n is an integer from 0-6.

While n can have a value from 0-6, it will be understood that for some Q groups the value of n is restricted by the chemistry of the group. In some embodiments, n is 0 or 1. In some embodiments, Q is an aryl group having at least two fused rings. In some embodiments, Q has 3-5 fused aromatic rings. In some embodiments, Q is selected from the group consisting of chrysene, phenanthrene, triphenylene, phenanthroline, naphthalene, anthracene, quinoline and isoquinoline.

The dopant is an electroactive material which is capable of electroluminescence having an emission maximum between 380 and 750 nm. In some embodiments, the dopant emits red, green, or blue light.

Electroluminescent ("EL") materials which can be used as a dopant in the electroactive layer, include, but are not limited to, small molecule organic luminescent compounds, luminescent metal complexes, conjugated polymers, and mixtures thereof. Examples of small molecule luminescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Examples of red light-emitting materials include, but are not limited to, periflanthenes, fluoranthenes, and perylenes. Red light-emitting materials have been disclosed in, for example, U.S. Pat. No. 6,875,524, and published US application 2005-0158577.

Examples of green light-emitting materials include, but are not limited to, diaminoanthracenes, and polyphenylenevinylene polymers. Green light-emitting materials have been disclosed in, for example, published PCT application WO 2007/021117.

Examples of blue light-emitting materials include, but are not limited to, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

In some embodiments, the dopant is an organic compound. In some embodiments, the dopant is selected from the group consisting of a non-polymeric spirobifluorene compound and a fluoranthene compound.

In some embodiments, the dopant is a compound having aryl amine groups. In some embodiments, the electroactive dopant is selected from the formulae below:

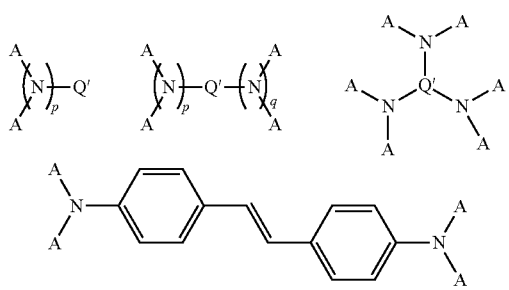

where:

A is the same or different at each occurrence and is an aromatic group having from 3-60 carbon atoms;

Q' is a single bond or an aromatic group having from 3-60 carbon atoms;

p and q are independently an integer from 1-6.

In some embodiments of the above formula, at least one of A and Q' in each formula has at least three condensed rings. In some embodiments, p and q are equal to 1.

In some embodiments, Q' is a styryl or styrylphenyl group. In some embodiments, Q' is an aromatic group having at least two condensed rings. In some embodiments, Q' is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, biphenyl, tolyl, naphthyl, naphthylphenyl, and anthracenyl groups.

In some embodiments, the dopant has the formula below:

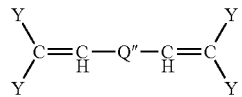

where:

Y is the same or different at each occurrence and is an aromatic group having 3-60 carbon atoms;

Q" is an aromatic group, a divalent triphenylamine residue group, or a single bond.

In some embodiments, the dopant is an aryl acene. In some embodiments, the dopant is a non-symmetrical aryl acene.

In some embodiments, the dopant is an anthracene derivative having Formula IV:

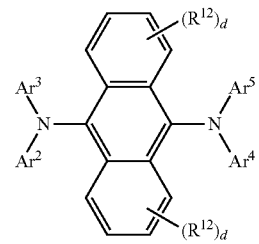

Formula IV wherein:

$R^{12}$ is the same or different at each occurrence and is selected from the group consisting of D, alkyl, alkoxy and aryl, where adjacent $R^{12}$ groups may be joined together to form a 5- or 6-membered aliphatic ring;

$Ar^2$ through $Ar^5$ are the same or different and are selected from the group consisting of aryl groups;

d is the same or different at each occurrence and is an integer from 0 to 4; and In some embodiments, the dopant of Formula IV is deuterated. In some embodiments, the aryl groups are deuterated. In some embodiments, the alkyl groups are deuterated. In some embodiments, the dopant is at least 20% deuterated; in some embodiments, at least 30% deuterated; in some embodiments, at least 40% deuterated; in some embodiments, at least 50% deuterated in some embodiments, at least 60% deuterated; in some embodiments, at least 70% deuterated; in some embodiments, at least 80% deuterated; in some embodiments, at least 90% deuterated; in some embodiments, 100% deuterated.

In some embodiments, the dopant is a chrysene derivative having Formula V:

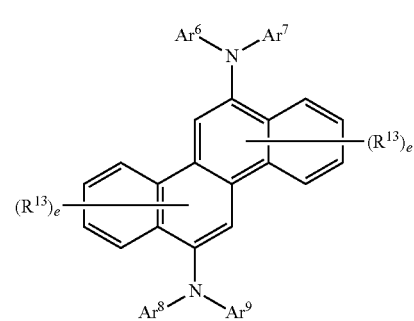

Formula V wherein:

$R^{13}$ is the same or different at each occurrence and is selected from the group consisting of D, alkyl, alkoxy aryl, fluoro, cyano, nitro, $SO_2R^{12}$, where $R^{12}$ is alkyl or perfluoroalkyl, where adjacent $R^{11}$ groups may be joined together to form a 5- or 6-membered aliphatic ring;

$Ar^6$ through $Ar^9$ are the same or different and are selected from the group consisting of aryl groups; and e is the same or different at each occurrence and is an integer from 0 to 5

In some embodiments, the dopant of Formula V is deuterated. In some embodiments, the aryl groups are deuterated. In some embodiments, the alkyl groups are deuterated. In some embodiments, the dopant is at least 30% deuterated; in some embodiments, at least 40% deuterated; in some embodiments, at least 50% deuterated in some embodiments, at least 60% deuterated; in some embodiments, at least 70% deuterated; in some embodiments, at least 80% deuterated; in some embodiments, at least 90% deuterated; in some embodiments, 100% deuterated.
Some non-limiting examples of green dopants are compounds D1 through D8 shown below.
D1:
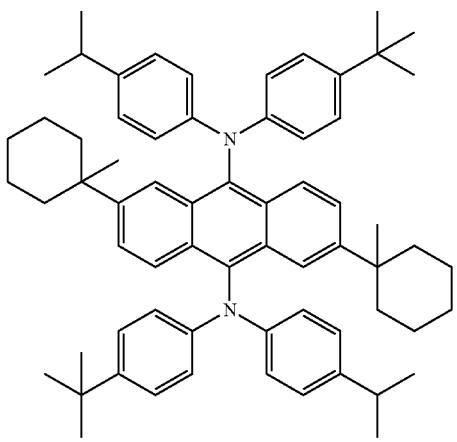
D2:
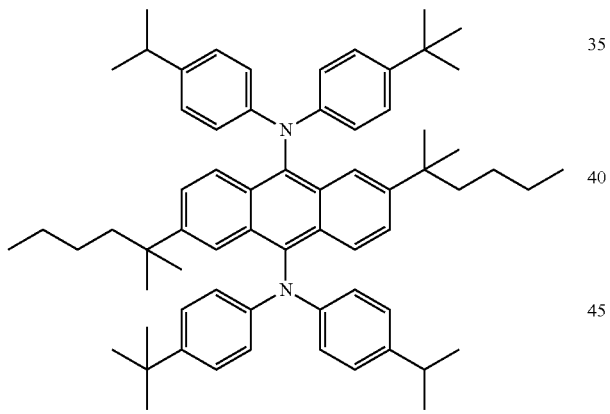
D3:
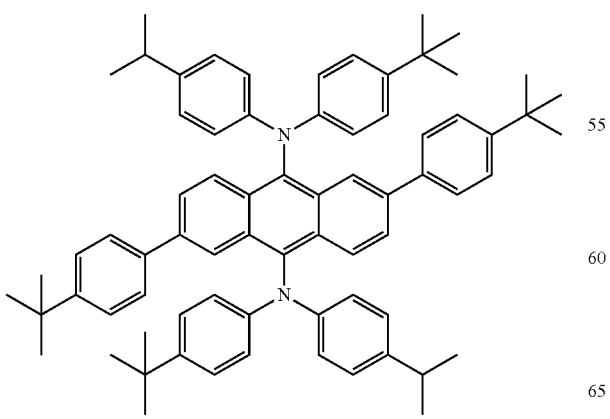
D4:
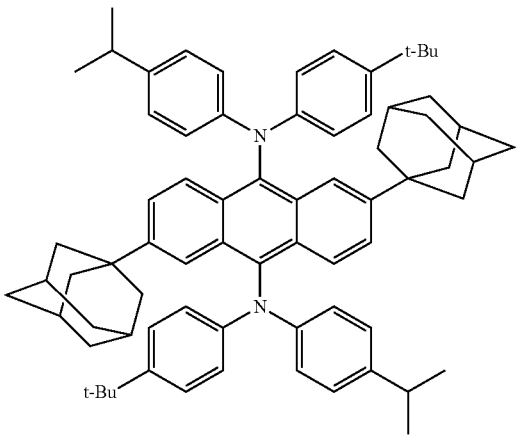
D5:
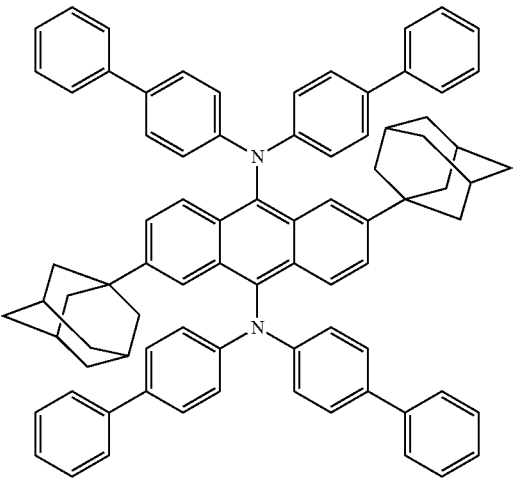
D6:
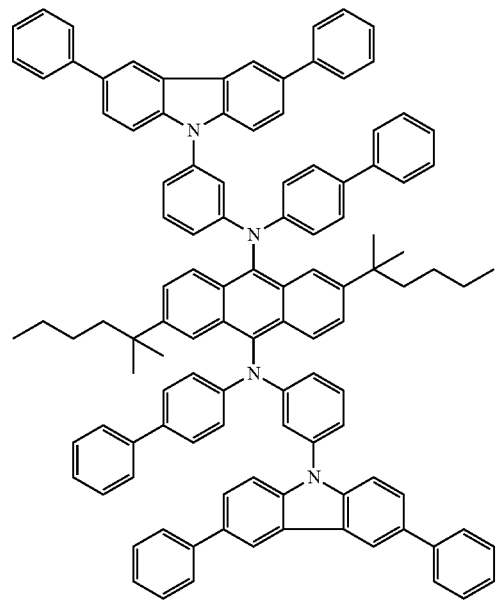

D7:
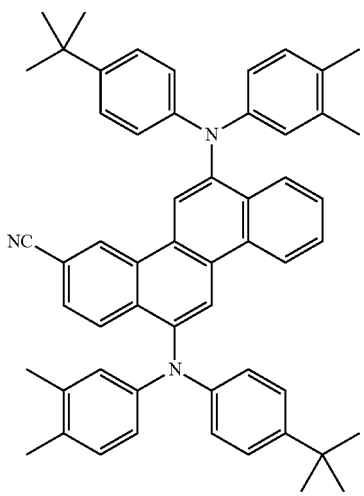
D8:
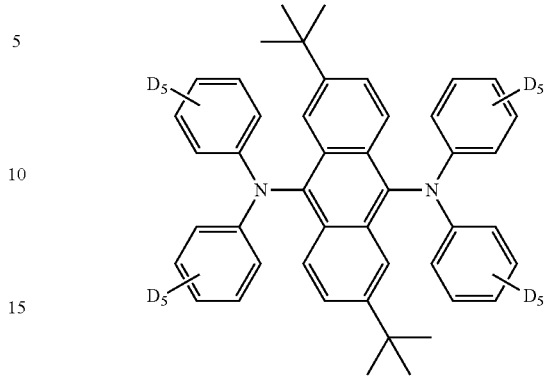
Some non-limiting examples of blue dopants are compounds D9 through D16 shown below.
D9:
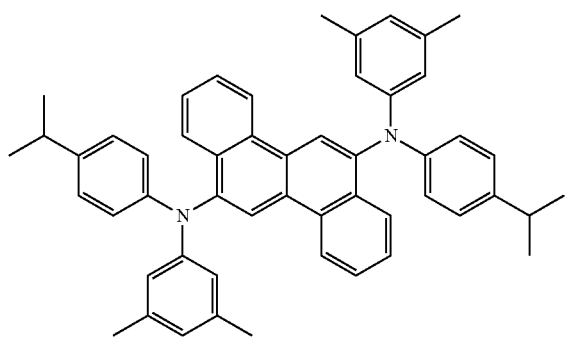
D10:
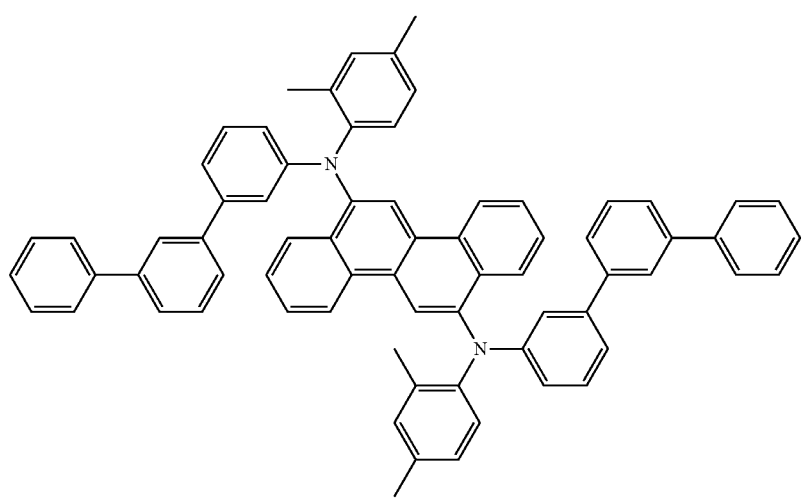

-continued
D11:
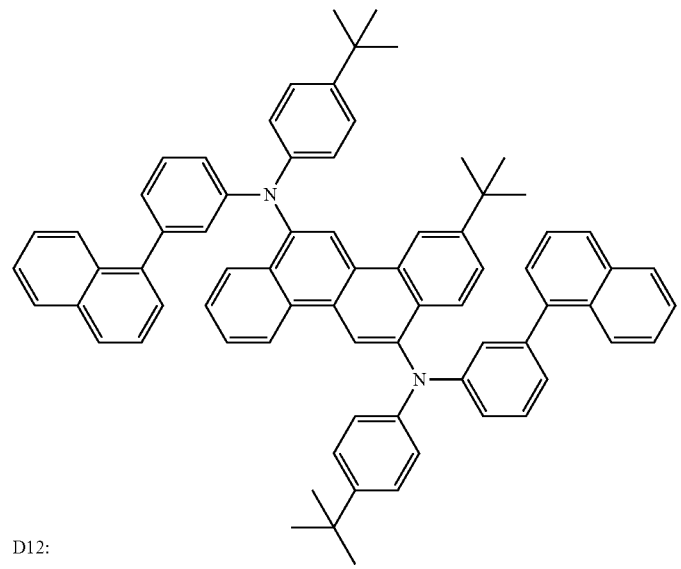
D12:
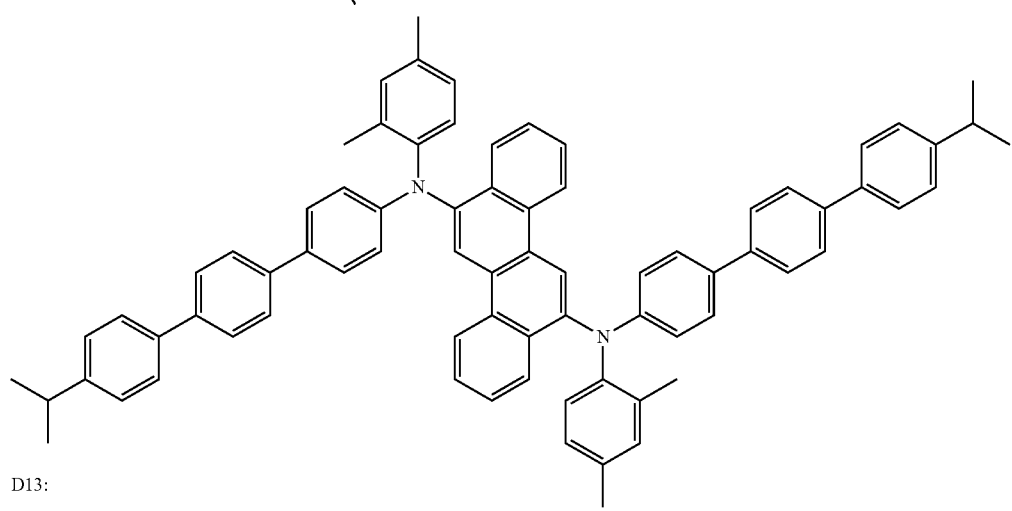
D13:
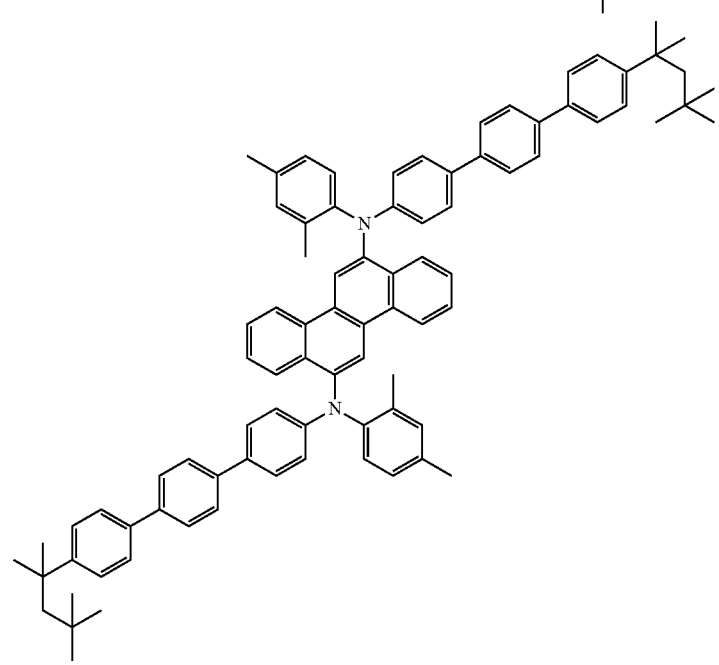

D14:
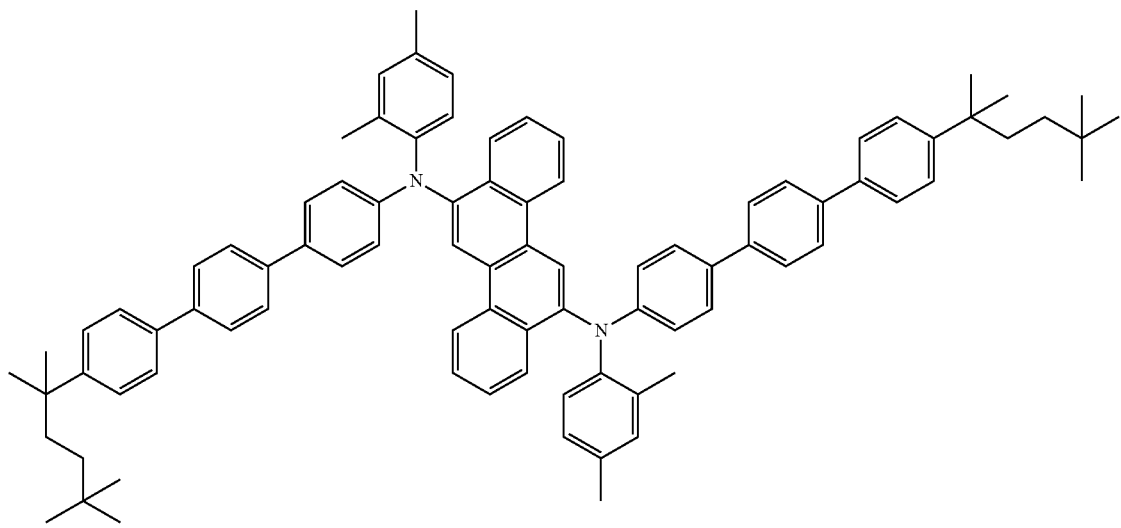
D15:
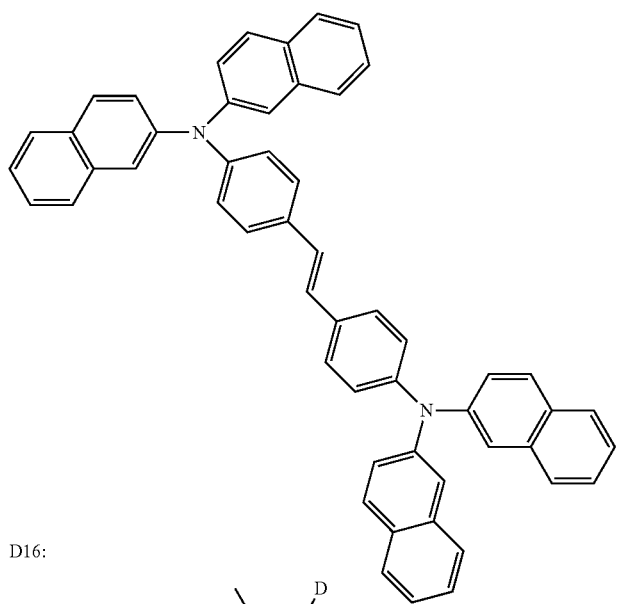
D16:
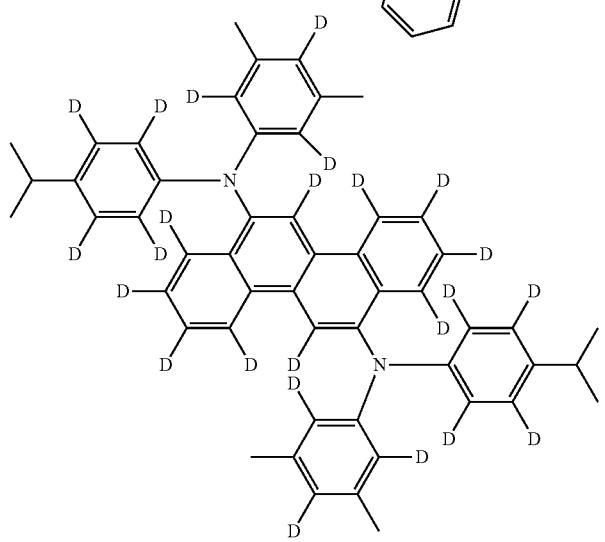

In some embodiments, the electroactive dopant is selected from the group consisting of amino-substituted chrysenes and amino-substituted anthracenes.

In some embodiments, the new deuterated compound described herein is an electroluminescent material and is present as an electroactive material.

b. Other Device Layers

The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," *Nature* vol. 357, pp 477-479 (11 Jun. 1992). At least one of the anode and cathode is desirably at least partially transparent to allow the generated light to be observed.

The hole injection layer 120 comprises hole injection material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules. They may be vapour deposited or deposited from liquids which may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The hole injection layer can comprise charge transfer compounds, and the like, such as copper phthalocyanine and the tetrathiafulvalene-tetracyanoquinodimethane system (TTF-TCNQ).

In some embodiments, the hole injection layer comprises at least one electrically conductive polymer and at least one fluorinated acid polymer. Such materials have been described in, for example, published U.S. patent applications 2004-0102577, 2004-0127637, and 2005/205860 In some embodiments, the hole transport layer 130 comprises the new deuterated compound of Formula I. Examples of other hole transport materials for layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluorotetracyanoquinodimethane and perylene-3,4,9,10-tetracarboxylic-3,4,9,10-dianhydride.

In some embodiments, the electron transport layer 150 comprises the new deuterated compound of Formula I. Examples of other electron transport materials which can be used in layer 150 include metal chelated oxinoid compounds, such as tris(8-hydroxyquinolato)aluminum ($Alq_3$); bis(2-methyl-8-quinolinolato)(para-phenyl-phenolato)aluminum(III) (BAlQ); and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and mixtures thereof. The electron-transport layer may also be doped with n-dopants, such as Cs or other alkali metals. Layer 150 can function both to facilitate electron transport, and also serve as a buffer layer or confinement layer to prevent quenching of the exciton at layer interfaces. Preferably, this layer promotes electron mobility and reduces exciton quenching.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li- or Cs-containing organometallic compounds, LiF, CsF, and $Li_2O$ can also be deposited between the organic layer and the cathode layer to lower the operating voltage.

It is known to have other layers in organic electronic devices. For example, there can be a layer (not shown) between the anode 110 and hole injection layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device can be prepared by a variety of techniques, including sequential vapor deposition of the individual layers on a suitable substrate. Substrates such as glass, plastics, and metals can be used. Conventional vapor deposition techniques can be used, such as thermal evaporation, chemical vapor deposition, and the like. Alternatively, the organic layers can be applied from solutions or dispersions in suitable solvents, using conventional coating or printing techniques, including but not limited to spin-coating, dip-coating, roll-to-roll techniques, ink-jet printing, screen-printing, gravure printing and the like.

The present invention also relates to an electronic device comprising at least one active layer positioned between two electrical contact layers, wherein the at least one active layer of the device includes the anthracene compound of Formula 1. Devices frequently have additional hole transport and electron transport layers.

To achieve a high efficiency LED, the HOMO (highest occupied molecular orbital) of the hole transport material desirably aligns with the work function of the anode, and the LUMO (lowest un-occupied molecular orbital) of the electron transport material desirably aligns with the work function of the cathode. Chemical compatibility and sublimation temperature of the materials are also important considerations in selecting the electron and hole transport materials.

It is understood that the efficiency of devices made with the anthracene compounds described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

The compounds of the invention often are photoluminescent and can be useful in applications other than OLEDs, such as oxygen sensitive indicators and as luminescent indicators in bioassays.

EXAMPLES

The following examples illustrate certain features and advantages of the present invention. They are intended to be illustrative of the invention, but not limiting. All percentages are by weight, unless otherwise indicated.

Example 1

This example illustrates the preparation of a deuterated diarylpyrene compound having Formula I, Compound A3.
Intermediate a:

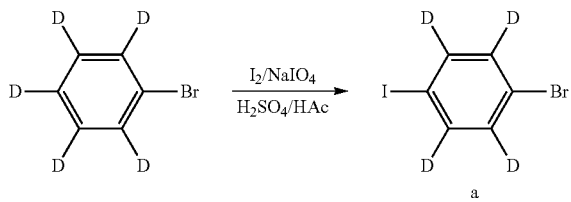

To d5-bromobenzene (MW 162, 100 g, 0.617 mol), was added a mixture solvents of 93 mL of 50% $H_2SO_4$, and 494 mL of HOAc at rt. Then a pulverized $I_2$ (MW 254, 61.7 g, 0.243 mol) was added followed by pulverized $NaIO_4$ (MW 214, 26.4 g, 0.123 mol). The mixture was vigorously stirred and heated to 90° C. for 4 h. The dark purple color solution changed to a pale-orange-colored mixture containing a very fine white precipitate. The mixture was allowed to cool to rt overnight. During this time, the product precipitated as microcrystalline plates. The mixture was filtered and was washed twice 10% sodium thiosulfate $Na_2S_2O_3$ (50 mL) and then with water. It was dissolved in $CH_2Cl_2$ and run flash column. The light yellow, crystalline material was obtained 124 g (70%). The filtrate was extracted with $CH_2Cl_2$ (50 mL x3) and combined the $CH_2Cl_2$ washed twice 10% sodium thiosulfate $Na_2S_2O_3$ (50 mL) and then with water. After dried and evaporated the solvent and run flash column to give another 32 g of pure product (17.5%). Total is 156 g (yield 88%).

Intermediate b:

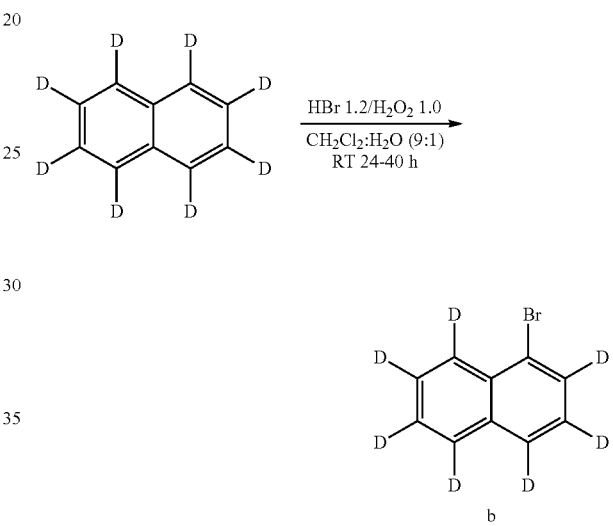

To a stirred solution of naphalene-d8 (MW 136, 68 g, 0.5 mole) in CH2Cl2 (800 mL): H20 (80 mL) and hydrobromic acid (MW: 81, d=1.49, 100 g; 67.5 mL of a 49% aq. solution; 0.6 mol) was slowly added hydrogen peroxide (FW: 34, d=1.1 g/mL, 56 g; 51.5 mL of a 30% aq. solution; 0.5 mol) over a period of 30 min at 10-15° C. The reaction was left at room temperature for 40 h whilst monitoring its progress by TLC. After the completion of bromination, the solvent was removed under reduced pressure and the crude product was washed twice 10% sodium thiosulfate Na2S2O3 (50 mL) and then with water. The pure product was isolated by flash column chromatography on silica gel (100-200 mesh) using hexane (100%) followed by distillation to give pure 1-bromo-naphthene-d7 as a clear liquid 85 g, the yield is around 80%.

Intermediate c:

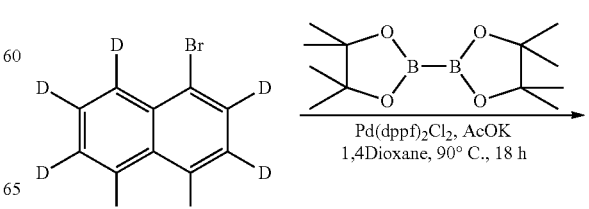

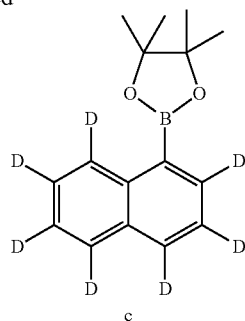

c

The mixture of 1-bromonaphthalene-d7 (21.4 g, 0.10 mol), bis(pinacolato)diboron (38 g, 0.15 mol), potassium acetate (19.6 g, 0.20 mol) in 300 ml of dry 1,4-dioxane was bubbled with nitrogen for 15 min. Then Pd(dppf)$_2$Cl$_2$—CH$_2$Cl$_2$(1.63 g, 0.002 mol) was added. The mixture was heated at 100° C. (oil bath) for 18 h. After cooling down the mixture was filtered through CELIT and then concentrated to 50 mL, then added water and extracted with ether for three times (100 mL ×3). The organic layer was washed with water (3×) and brine (1×), dried over MgSO$_4$, filtered and concentrated. The residue was submitted to a silica gel column (eluent: hexane) to give a white liquid which has by products of naphalene, and diboronic ester. Thus futher purification was conducted by distilliation to give a viscous clear liquid. Yield 21 g, 82%.

Intermediate d:

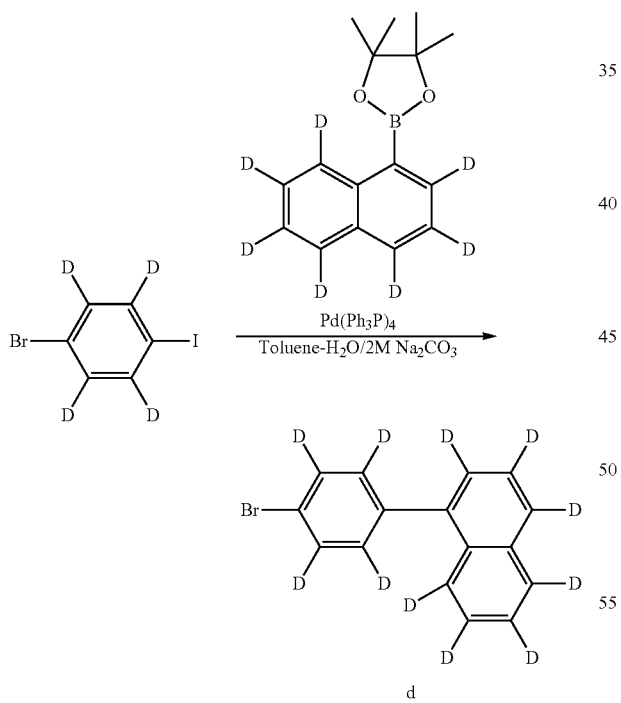

d

To a mixture of 1-bromo-4-iodo-benzene-D4 (10.95 g, 0.0382 mole) and 1-naphaleneboronic ester-D7 (10.0 g, 0.0383 mole) in Toluene (300 mL) was added Na$_2$CO$_3$ (12.6 g, 0.12 mole) and H$_2$O (50 mL), aliquant (3 g). The mixture was bubbled with nitrogen for 15 min. Then Pd(PPh3)4 (0.90 g, 2%) was added. The mixture was refluxed for 12 h under a nitrogen atmosphere. After cooling down the reaction mixture was separated, the organic layer was washed with water and separated, dried and concentrated. Silica was added and concentrated. After evaporation the residue solvent, it was subject to run flash column using hexane as eluent to give crude product. Further purification was conducted by distillation (collect 135-140° C./100 mtorr) to give clear viscous liquid (8.76 g, yield 78%).

Intermediate e:

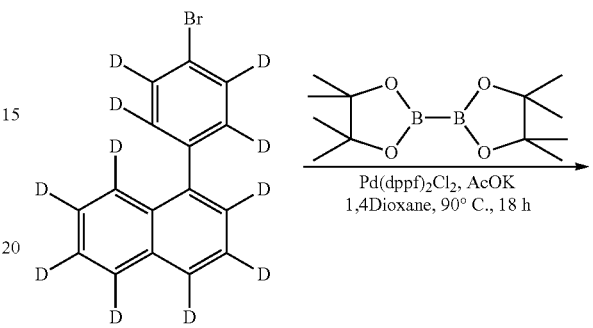

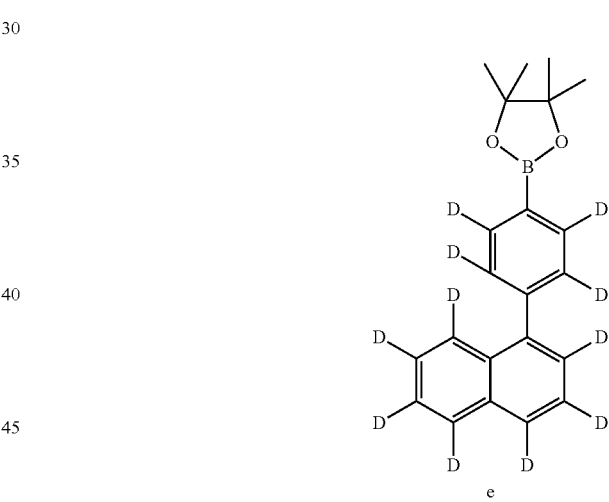

e

The mixture of 1-bromo-phenyl-4-naphthalene-d11 (22 g, 0.075 mole), bis(pinacolato)diboron (23 g, 0.090 mol), potassium acetate 22 g, 0.224 mol) in 200 ml of dry 1,4-dioxane was bubbled with nitrogen for 15 min. Then Pd(dppf)$_2$Cl$_2$.CH$_2$Cl$_2$(1.20 g, 0.00147 mol) was added. The mixture was heated at 100° C. (oil bath) for 18 h. After cooling down the mixture was filtered through CELIT and then concentrated to 50 mL, then added water and extracted with ether for three times (100 mL ×3). The organic layer was washed with water (3×) and brine(1×), dried over MgSO$_4$, filtered and concentrated. The residue was submitted to a silica gel column (eluent: hexane) to give a white liquid which has by products of naphalene, and diboronic ester. Thus further purification was conducted by run silica gel column again using hexane as eluent . After evaporate the solvent and concentrated to around 80 mL hexane and white crystal product was formed, it was filtrate to give 20.1 g of product, yield 81%.

Intermediate f:

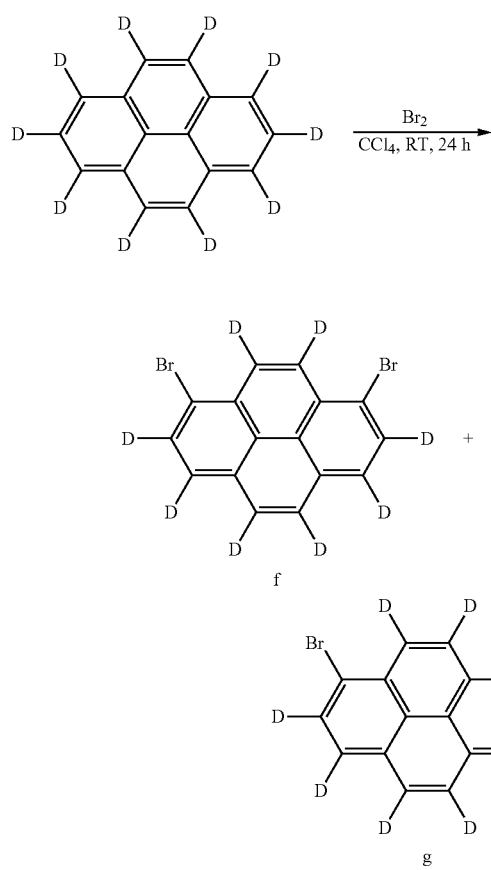

To a stirred solution of pyrene-d10 (25 g, 0.12 mol) in CCl$_4$ (1500 mL) was added Br$_2$ (35.8 g, 0.22 mol)/CCl$_4$ (150 mL) drop-wise at RT. After addition the mixture was stirred for 24 h. The solid was filtered and washed with MeOH to give a solid 32.21 g, which was stirred with 634 mL of THF at RT for 1-2 days. The mixture was filtered to give a solid A, 16 g (1,6-dibromopyrene). The filtrate was put in the refrigerator for 1 day. The solid was then filtered to give a solid (~0.6 g, 1.6:1.8=~1:1). The filtrate was concentrated to ~150 mL, put in the refrigerator for 1 day. The solid was filtered to give 10.3 g, which was recrystallized from toluene (260 mL) to give 5.2 g. 5.2 g of solid was heated to dissolve in 50 mL of THF. After cooling down the solid was filtered to give Intermediate B, 4.21 g, 10%, HPLC 98.5%.

Compound A3:

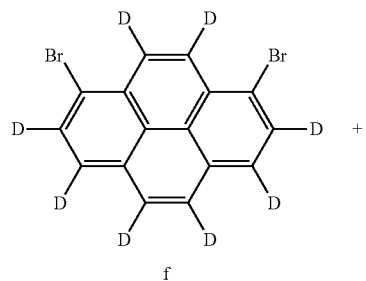

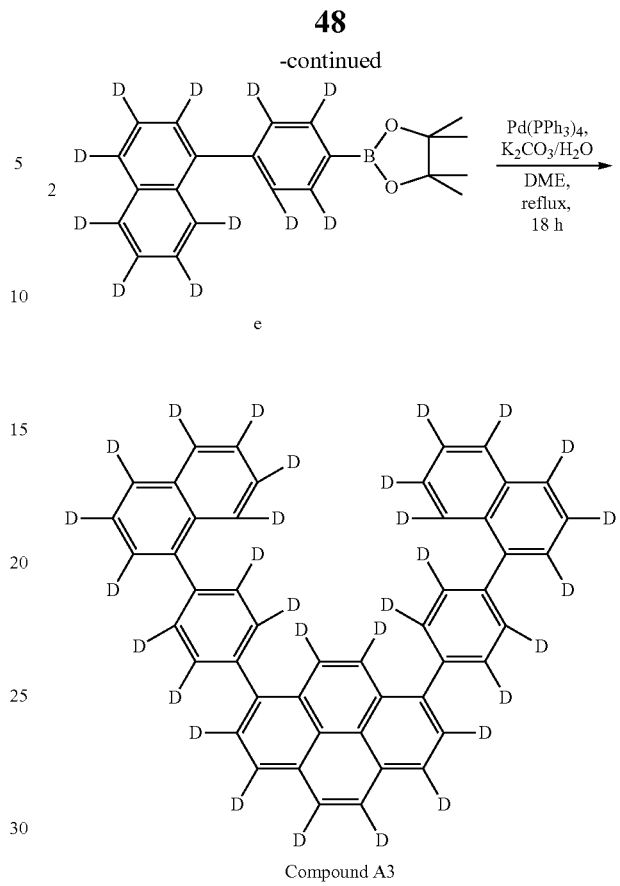

Compound A3

To a mixture of f (2.94 g, 0.008 mol) and e (6.28 g, 0.018 mol) in DME (100 mL) was added K$_2$CO$_3$ (6.63 g, 0.048 mol) and H$_2$O (16 mL). The mixture was bubbled with nitrogen for 15 min. Then Pd(PPh$_3$)$_4$ (0.46 g, 0.4 mmol) was added. The mixture was refluxed for 18 h under a nitrogen atmosphere. After cooling down the mixture was poured into MeOH. The solid was filtered and purified by Isolera, Florisil column, recrystallized from CHCl$_3$/CH$_3$CN (2:1) to give product Compound A3, 1.45 g, 28%, HPLC 98.2%.

Comparative Example A

This comparative example illustrates the preparation of 1,8-Bis-(4-naphthalen-1-yl-phenyl)-pyrene, Comparative X. This comparative compound is the non-deuterated analog of Compound A3.

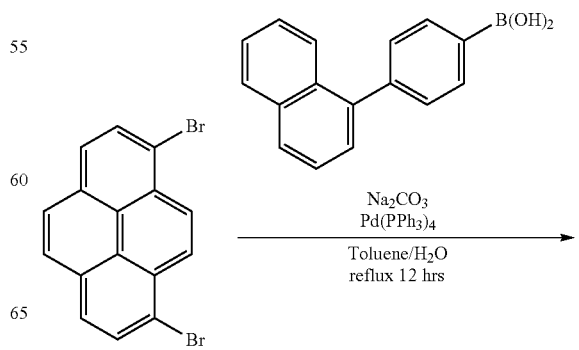

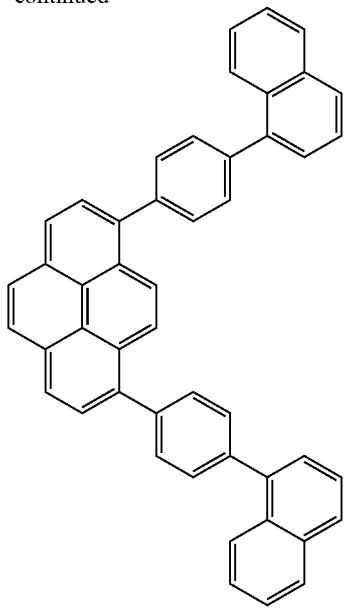

Comparative X

Into a RBF (500 mL) was added 1,8-dibromopyrene (10 g, 27.6 mmol), 3-(2-naphthenylphenylboronic acid (16.5 g, 66.3 mmol), followed by the addition of toluene (300 mL). The mixture was purged with N2 for 10 min. Then $Na_2CO_3$ (14.6 g, 138 mmole) dissolved in the water (70 mL) was added. The mixture was continued to be purged with $N_2$ for 10 min. A catalytic amount of $Pd(PPh_3)_4$ (0.16 g) was added. The mixture was refluxed for 4 h. First, a clear solution was formed (in about 2 h). Then 2 h later a light white precipitate was formed. Continued reflux overnight. A slightly white precipitate was formed. Filtered through silica pad at 70-90° C. to remove black Pd. After concentration, the solid was slurried with hot THF/Acetone(100 ml/100 ml) for 12 hrs. Filtered and washed with THF and dried. An off-white powder was formed (11.55 g, yield: 68.8%). Further purification of the compound by train submission affords 7.4 g pure compound (purity 99.9%). The $^1$H NMR spectrum was consistent with the structure of Comparative X.

Example 2 and Comparative Example B

This example demonstrates the fabrication and performance of a device having deep blue emission.

In Example 2, the host material was Compound A3. In Comparative Example B, the host material was Comparative X.

The electroluminescent material E1 had the structure given below.

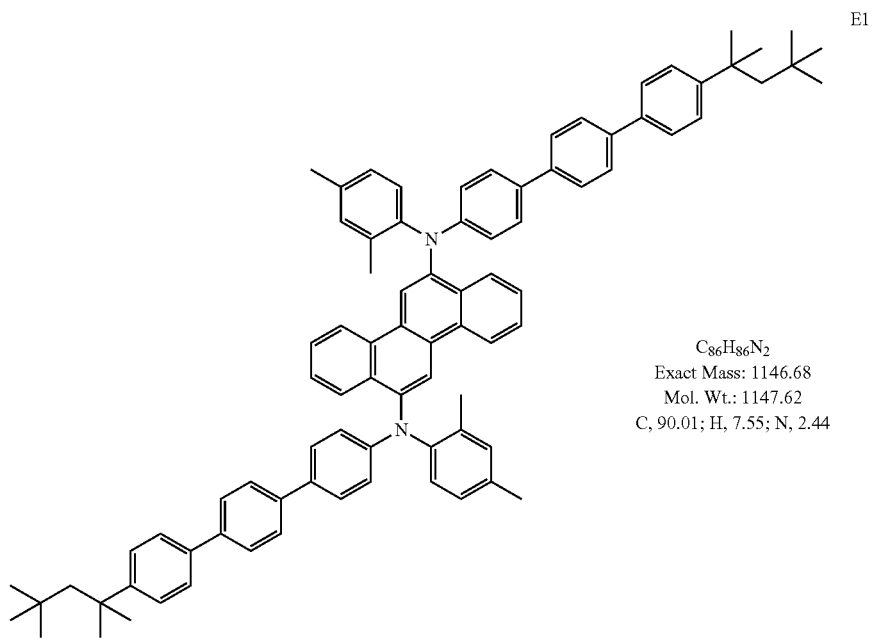 [SMILES: Cc1ccc(N(c2ccc(-c3ccc(-c4ccc(C(C)(C)CC(C)(C)C)cc4)cc3)cc2)c2cc3c4ccccc4c(N(c4ccc(-c5ccc(-c6ccc(C(C)(C)CC(C)(C)C)cc6)cc5)cc4)c4ccc(C)cc4C)cc3c3ccccc23)c(C)c1]

E1

$C_{86}H_{86}N_2$
Exact Mass: 1146.68
Mol. Wt.: 1147.62
C, 90.01; H, 7.55; N, 2.44

Compound E1 is made by combining 6,12-dibromochrysene, N-(2,4-dimethylphenyl)-N-(4"-tertoctylterphenyl-4-yl)amine, tris(tert-butyl)phosphine, and tris(dibenzylideneacetone) dipalladium(0) in a 20:40:2:1 molar ratio, respectively, in dry toluene in an inert atmosphere. To this solution is added sodium tert-butoxide (~45 relative molar ratio) followed by heating at 60° C. for 3 days. The reaction product is recovered as a solid and purified by silica gel column chromatography and recrystallization from DCM and acetonitrile.

The device had the following structure on a glass substrate:

anode=Indium Tin Oxide (ITO): 50 nm hole injection layer=HIJ 1 (50 nm), which is an aqueous dispersion of an electrically conductive polymer and a polymeric fluorinated sulfonic acid. Such materials have been described in, for example, published U.S. patent applications US 2004/0102577, US 2004/0127637, and US 2005/0205860.

hole transport layer=a non-crosslinked arylamine polymer (20 nm)

electroactive layer=13:1 host:dopant E1 (40 nm), as shown in Table 1 electron transport layer=a metal quinolate derivative (10 nm)

cathode=CsF/Al (1.0/100 nm)

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of Buffer 1 was spin-coated over the ITO surface and heated to remove solvent. After cooling, the substrates were then spin-coated with a solution of a hole transport material, and then heated to remove solvent. After cooling the substrates were spin-coated with the emissive layer solution, and heated to remove solvent. The substrates were masked and placed in a vacuum chamber. The electron transport layer was deposited by thermal evaporation, followed by a layer of CsF. Masks were then changed in vacuo and a layer of Al was deposited by thermal evaporation. The chamber was vented, and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A.

The results are given in Table 1.

TABLE 1

| | | Device Results | | | | |
|---|---|---|---|---|---|---|
| Example | Host | CE [cd/A] | Voltage [V] | CIE [x] | CIE [y] | Lifetime T50 [h] |
| Comparative B | Comparative X | 7.2 | 4.9 | 0.1325 | 0.1579 | 4547 |
| Example 2 | Compound A3 | 7.1 | 5.0 | 0.1329 | 0.1542 | 7490 |

All data @ 1000 nits, CE = current efficiency; CIEx and CIEy are the x and y color coordinates according to the C.I.E. chromaticity scale (Commission Internationale de L'Eclairage, 1931); T50 is the time to reach half the initial luminance.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. A compound selected from A1 through A34.

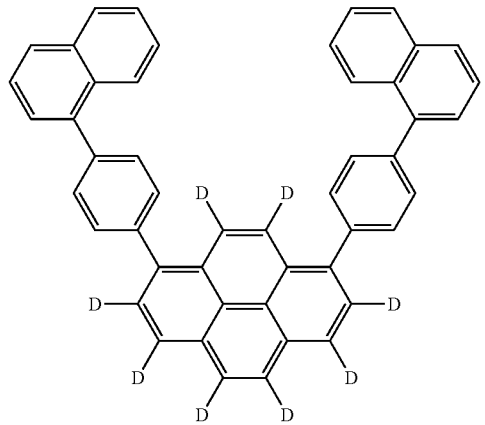

A1

A2
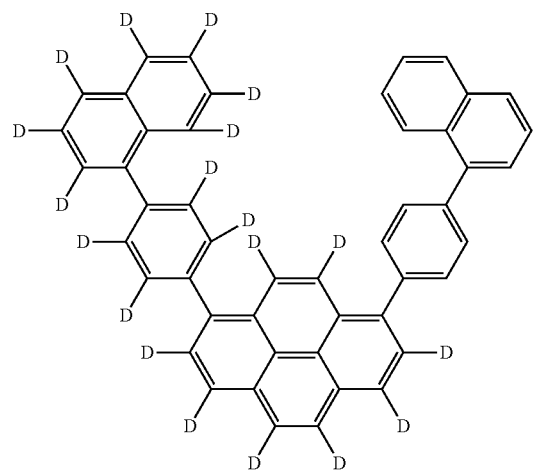
A5
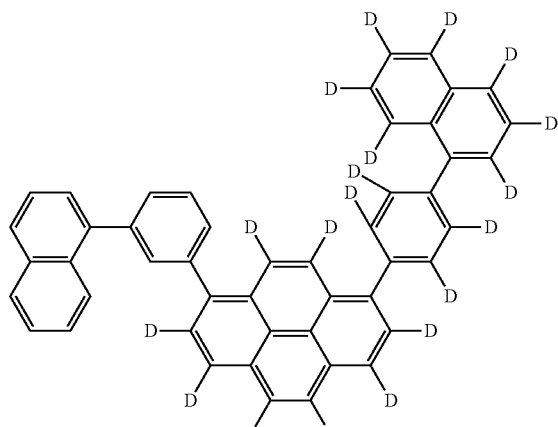
A3
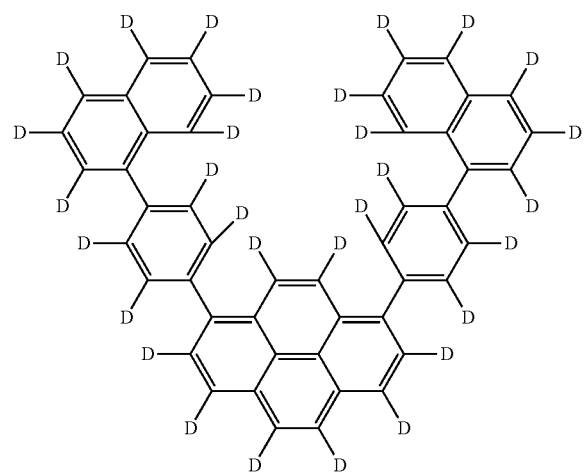
A6
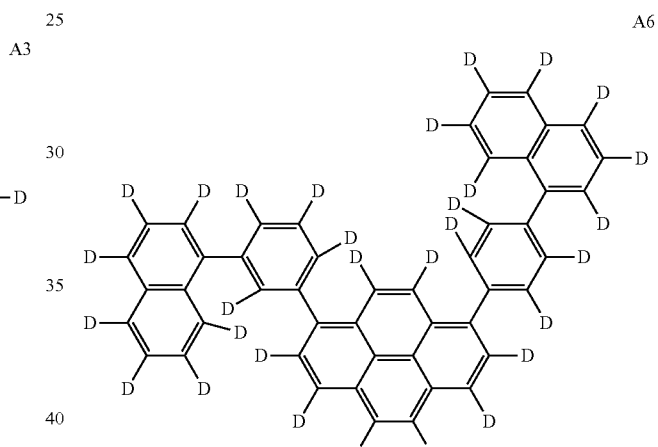
A4
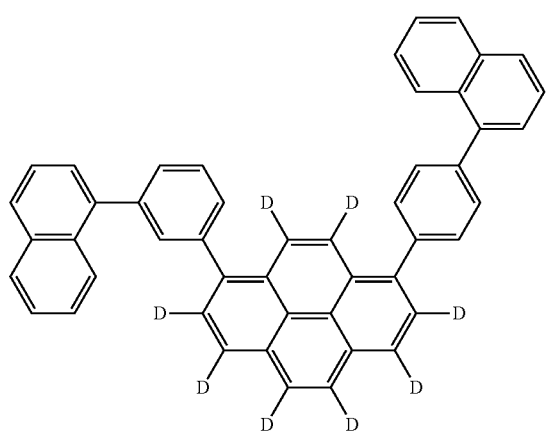
A7
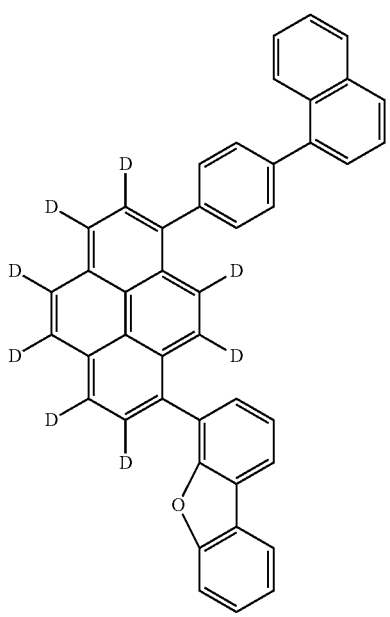

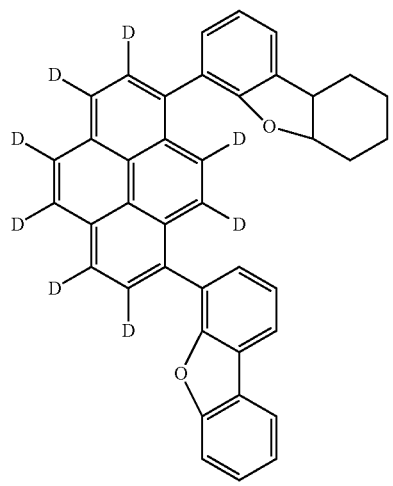
A8
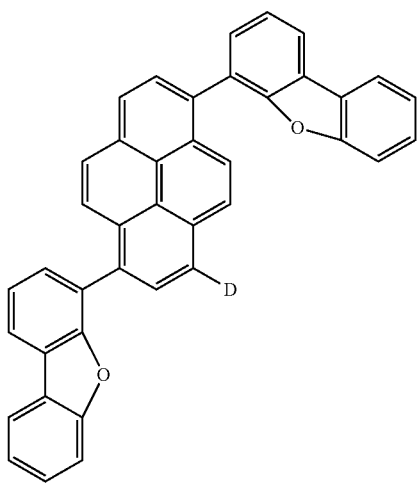
A11
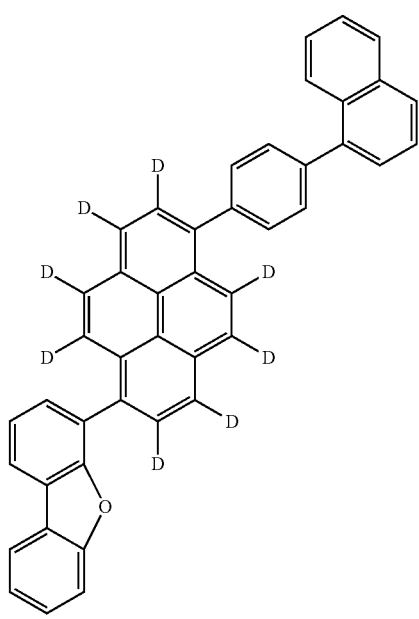
A9
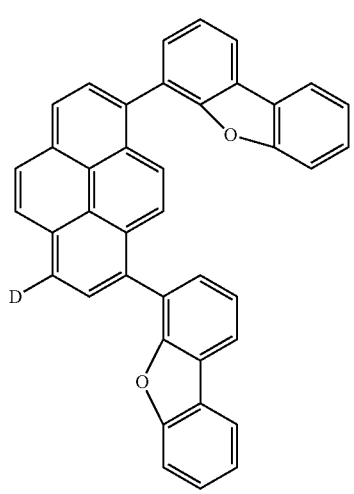
A12
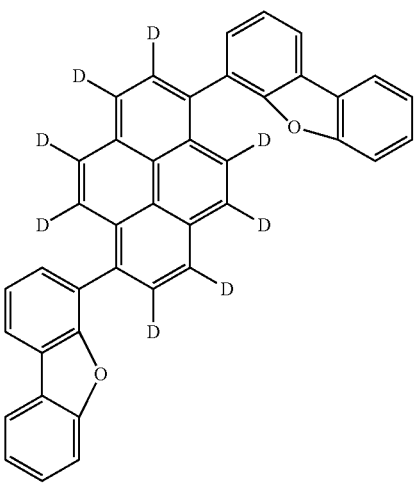
A10
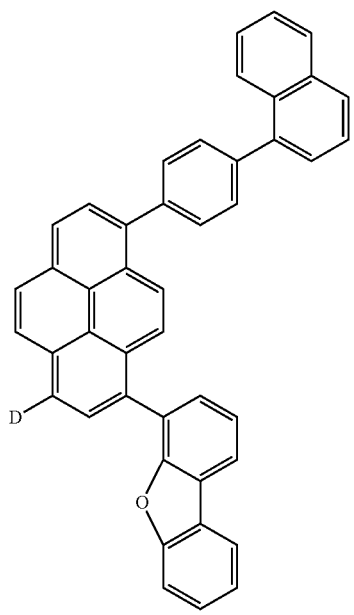
A13

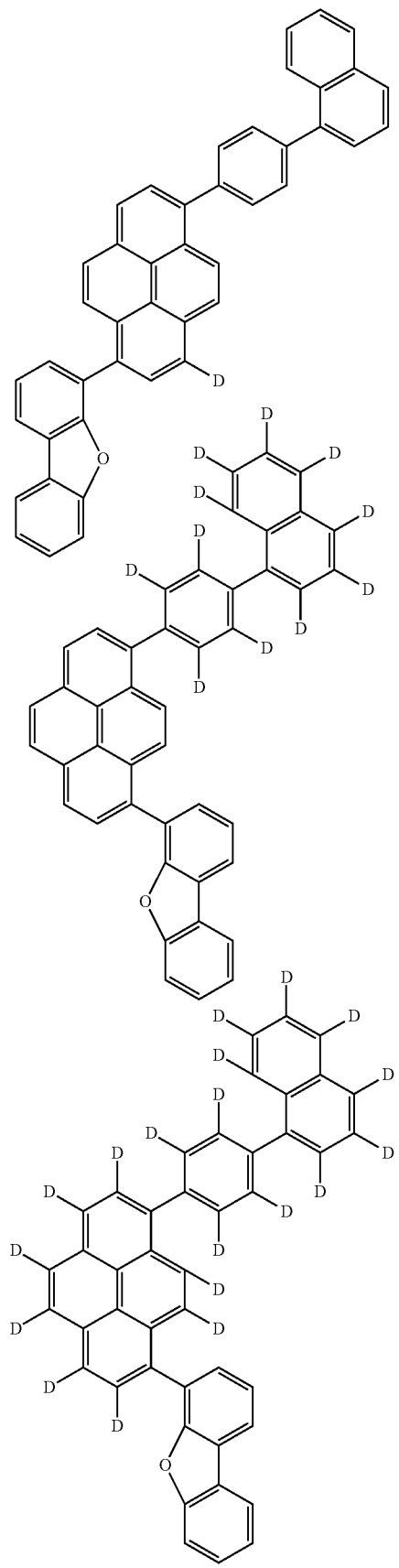
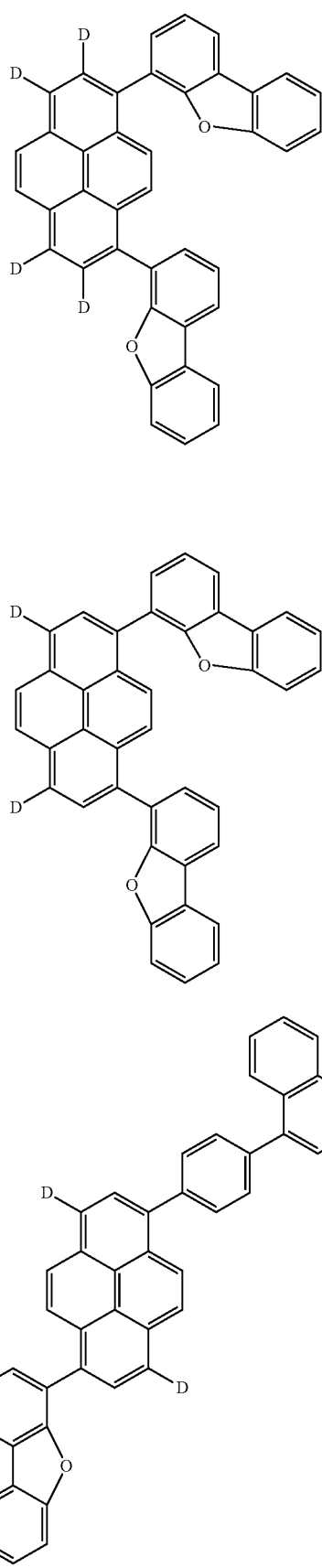

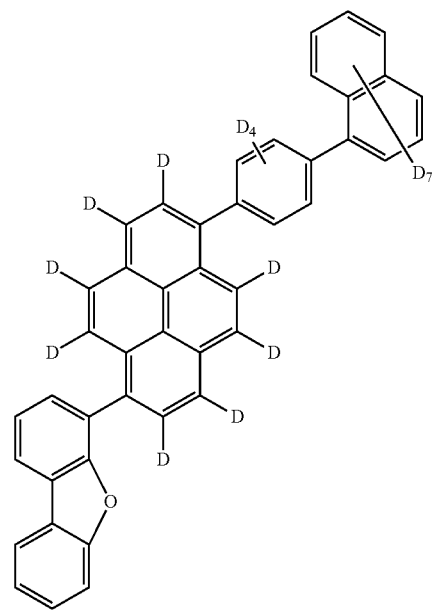 A20
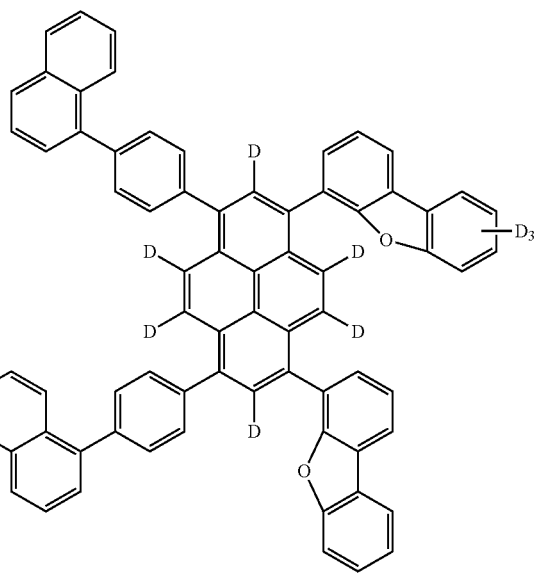 A23
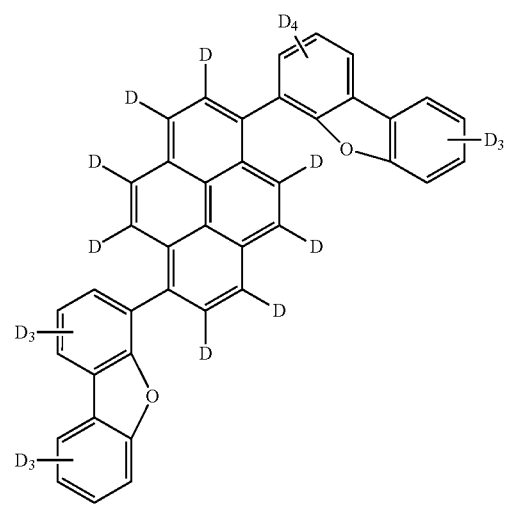 A21
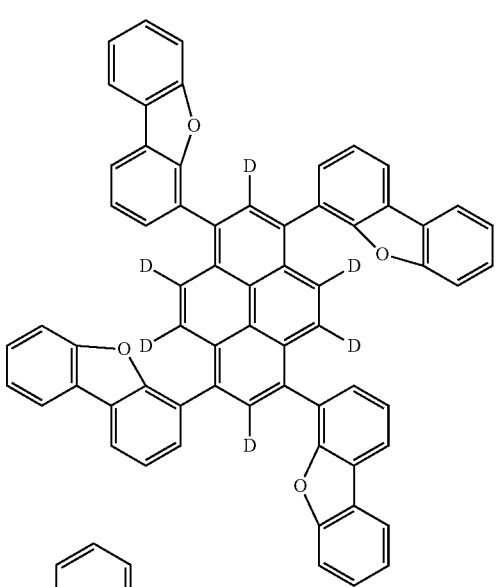 A24
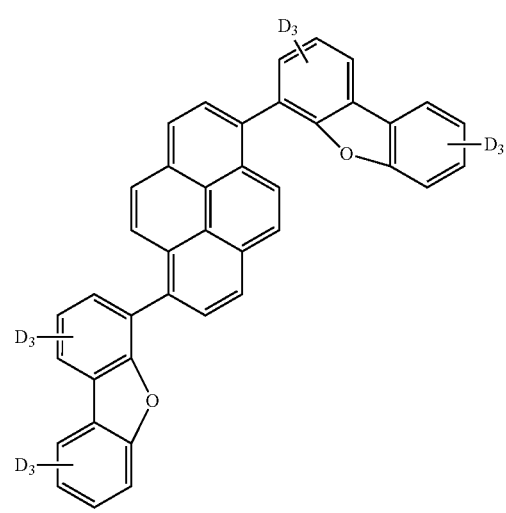 A22
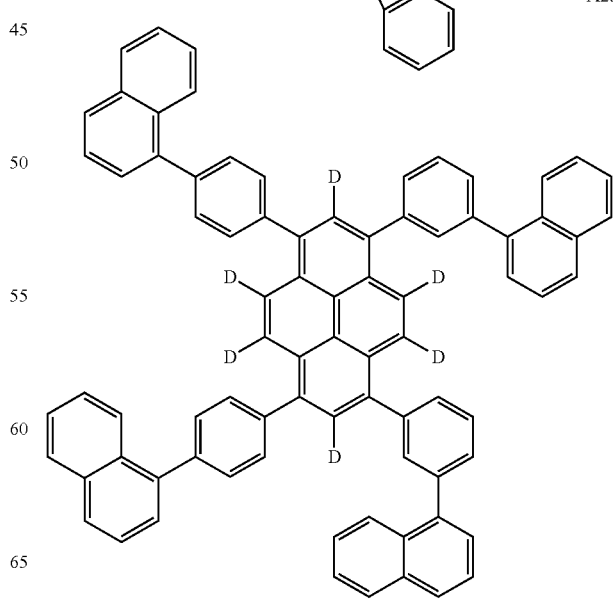 A25

A26
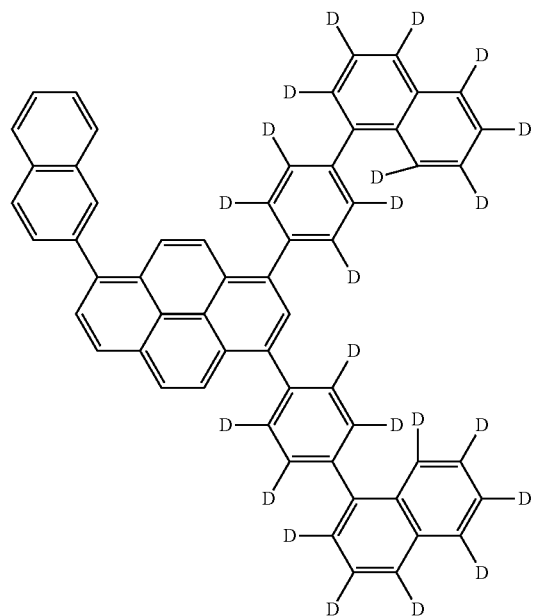
A27
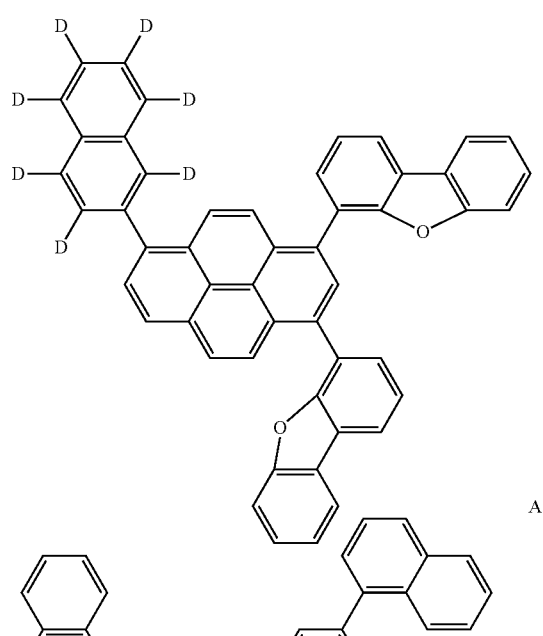
A28
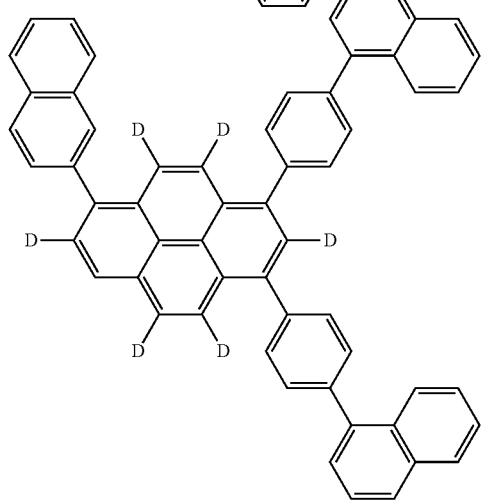
A29
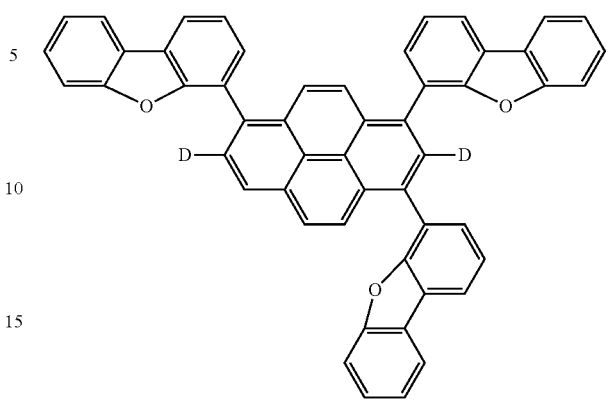
A30
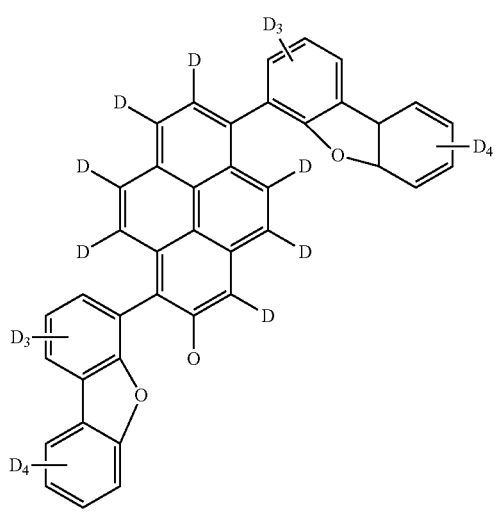
A31
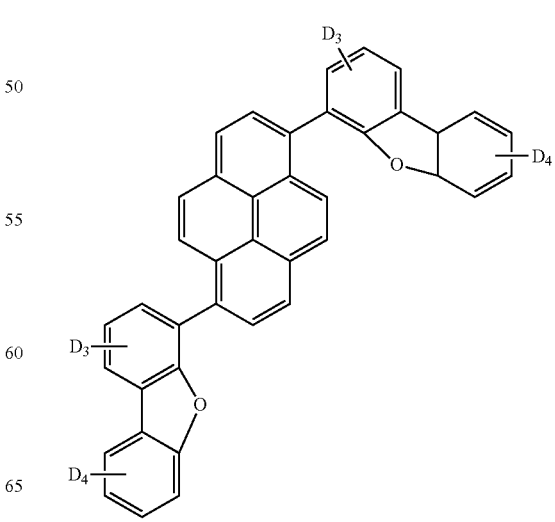

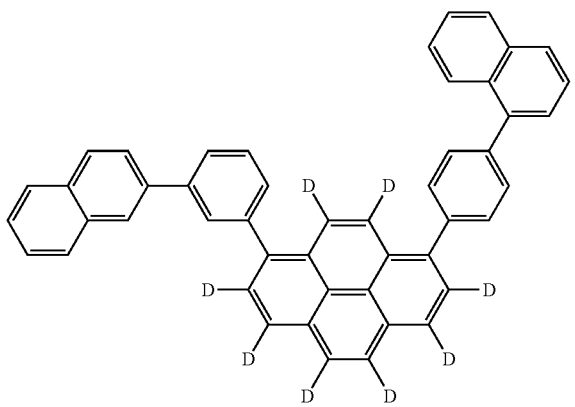

A32

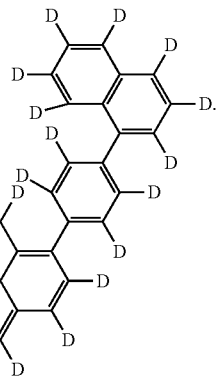

A34

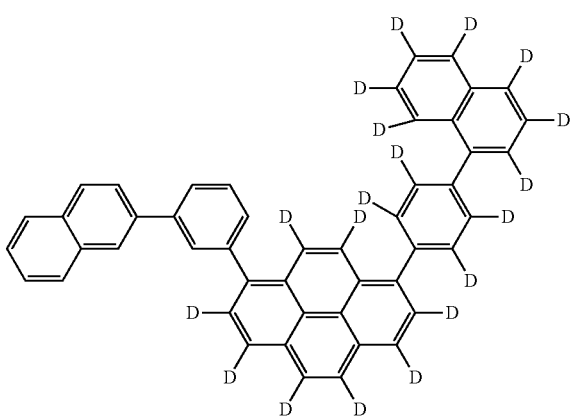

A33

2. An organic electronic device comprising a first electrical contact layer, a second electrical contact layer, and at least one active layer therebetween, wherein the active layer comprises the compound of claim 1.

3. The device of claim 2, wherein the active layer is an electroactive layer and further comprises an electroluminescent dopant material.

4. The device of claim 3, wherein the electroactive layer is a light-emitting layer.

* * * * *